United States Patent
Kim et al.

(10) Patent No.: US 8,724,384 B2
(45) Date of Patent: May 13, 2014

(54) MULTIPLE-BIT PER CELL (MBC) NON-VOLATILE MEMORY APPARATUS AND SYSTEM HAVING POLARITY CONTROL AND METHOD OF PROGRAMMING SAME

(71) Applicant: Mosaid Technologies Incorporated, Ottawa (CA)

(72) Inventors: Jin-Ki Kim, Ottawa (CA); William F. Petrie, Ottawa (CA)

(73) Assignee: Conversant Intellectual Property Management Inc., Ottawa, Ontario (CA)

( * ) Notice: Subject to any disclaimer, the term of this patent is extended or adjusted under 35 U.S.C. 154(b) by 0 days.

(21) Appl. No.: 13/777,485

(22) Filed: Feb. 26, 2013

(65) Prior Publication Data
US 2013/0170294 A1 Jul. 4, 2013

Related U.S. Application Data

(63) Continuation of application No. 13/117,715, filed on May 27, 2011, which is a continuation of application No. 12/782,047, filed on May 18, 2010, now Pat. No. 7,952,923, which is a continuation of application No. 12/166,876, filed on Jul. 2, 2008, now Pat. No. 7,729,166.

(51) Int. Cl.
*G11C 16/04* (2006.01)

(52) U.S. Cl.
USPC ............. 365/185.03; 365/185.18; 365/185.07

(58) Field of Classification Search
USPC ............................ 365/185.03, 185.18, 185.07
See application file for complete search history.

(56) References Cited

U.S. PATENT DOCUMENTS

| | | | |
|---|---|---|---|
| 5,303,367 | A | 4/1994 | Leenstra, Sr. et al. |
| 5,873,112 | A | 2/1999 | Norman |
| 5,907,855 | A | 5/1999 | Norman |
| 6,073,208 | A | 6/2000 | Norman |

(Continued)

FOREIGN PATENT DOCUMENTS

| | | |
|---|---|---|
| JP | 10055687 | 2/1998 |
| JP | 2001093288 | 4/2001 |

(Continued)

OTHER PUBLICATIONS

Samsung Electronics Co. Ltd., 1G ×8 Bit/2G ×8 Bit NAND Flash Memory, K9F8G08UXM, Technical Specification, 1-54, Mar. 31, 2007.

(Continued)

*Primary Examiner* — Connie Yoha

(57) ABSTRACT

A Multiple-bit per Cell (MBC) non-volatile memory apparatus, method, and system wherein a controller for writing/reading data to/from a memory array controls polarity of data by selectively inverting data words to maximize a number of bits to be programmed within (M−1) virtual pages and selectively inverts data words to minimize a number of bits to be programmed in an $M^{th}$ virtual page where M is the number of bits per cell. A corresponding polarity control flag is set when a data word is inverted. Data is selectively inverted according the corresponding polarity flag when being read from the M virtual pages. A number of the highest threshold voltage programming states in reduced. This provides tighter distribution of programmed cell threshold voltage, reduced power consumption, reduced programming time, and enhanced device reliability.

27 Claims, 22 Drawing Sheets

(56) References Cited

U.S. PATENT DOCUMENTS

| | | | |
|---|---|---|---|
| 6,870,763 B2 | 3/2005 | Banks | |
| 6,937,510 B2 | 8/2005 | Hosono et al. | |
| 7,359,245 B2 | 4/2008 | Kim et al. | |
| 7,561,464 B2 | 7/2009 | Toda | |
| 7,649,776 B2* | 1/2010 | Abiko et al. | 365/185.12 |
| 7,729,166 B2 | 6/2010 | Kim et al. | |
| 7,941,592 B2* | 5/2011 | Bonella et al. | 711/103 |
| 7,952,923 B2 | 5/2011 | Kim et al. | |
| 8,009,480 B2* | 8/2011 | Abiko et al. | 365/185.18 |
| 2004/0065904 A1 | 4/2004 | Yoshida et al. | |
| 2007/0011481 A1 | 1/2007 | Kwack et al. | |
| 2008/0130351 A1 | 6/2008 | Nirschi | |

FOREIGN PATENT DOCUMENTS

| | | |
|---|---|---|
| JP | 2005100527 | 4/2005 |
| JP | 2005116132 | 4/2005 |
| WO | 2007043042 | 4/2007 |
| WO | 2009048211 | 4/2009 |

OTHER PUBLICATIONS

Takeuchi, K. et al, A Multipage Cell Architecture for High-Speed Programming Multilevel NAND Flash Memories, IEEE Journal of Solid-State Circuits, vol. 33, Issue 8, Aug. 1998, 1228-1238.

Suh, K. et al, A 3.3 V 32 MB NAND Flash Memory With Incremental Step Pulse Programming Scheme, IEEE Journal of Solid-State Circuits, vol. 30, No. 11, Nov. 1995, 1149-1156.

Imamiya, K et al, A 125-MM2 1-GB NAND Flash Memory With 10-Mbyte/S Program Speed, IEEE Journal of Solid-State Circuits, vol. 37, No. 11, Nov. 2002, 1493-1501.

Kim, J. et al, A 120-MM2 64-MB NAND Flash Memory Achieving 180 NS/Byte Effective Program Speed, IEEE Journal of Solid-State Circuits, vol. 32, No. 5, May 1997, 670-680.

Jung, T. et al, A 117-MM2 3.3-V Only 128-MB Multilevel NAND Flash Memory for Mass Storage Applications, IEEE Journal of Solid-State Circuits, vol. 31, No. 11, Nov. 1996, 1575-1583.

Lee, June et al, A 90-NM CMOS 1.8-V 2-GB NAND Flash Memory for Mass Storage Applications, IEEE Journal of Solid-State Circuits, vol. 38, No. 11, Nov. 2003, 1934-1942.

Takeuchi, K. et al, A 56NM CMOS 99MM2 8GB Multi-Level Nand Flash Memory With 10MB/S Program Throughput, Solid-State Circuits, 2006 IEEE International Conference Digest of Technical Papers, Session 7, ISBN:1-4244-0079-1, 10 pages, Feb. 6, 2006.

Byeon, D. et al, An 8GB Multi-Level NAND Flash Memory With 63NM STI CMOS Process Technology, IEEE International Solid-State Circuits Conference, 46-47, Feb. 7, 2005.

Lee, S. et al, A 3.3V 4GB Four-Level NAND Flash Memory With 90NM CMOS Technology, ISSCC 2004/Session 2NON-Volatile Memory/2.7, IEEE International Solid-State Circuits Conference, Digest of Technical Papers, vol. 1, XPO10722148, ISBN: 0-7803-8267-6, 10 pages, Feb. 16, 2004.

Samsung Electronics Co. Ltd., 512M x 8 Bit/ 1G x 8 Bit NAND Flash Memory, K9XXG08UXA, 1-43, Mar. 7, 2006.

Hara, T. et al, A 146MM2 8GB NAND Flash Memory With 70NM CMOS Technology, ISSCC Session 2 Non-Volatile Memory 2.1, IEEE International Solid-State Circuits Conference, 44-45 and 584, Feb. 7, 2005.

* cited by examiner

MULTIPLE-BIT PER CELL (MBC) NON-VOLATILE MEMORY APPARATUS AND SYSTEM HAVING POLARITY CONTROL AND METHOD OF PROGRAMMING SAME

CROSS-REFERENCE TO RELATED APPLICATIONS

This application claims benefit to U.S. patent application Ser. No. 13/117,715 filed May 27, 2011 which is a continuation of U.S. patent application Ser. No. 12/782,047 filed May 18, 2010 now U.S. Pat. No. 7,952,923 issued May 31, 2011 which is a continuation of Ser. No. 12/166,876 filed Jul. 2, 2008 now U.S. Pat. No. 7,729,166 issued Jun. 1, 2010 which is herewith incorporated by reference.

TECHNICAL FIELD

The present invention relates generally to non-volatile memory systems and more specifically to a nonvolatile multiple-bit per cell (MBC) memory system having data polarity control.

BACKGROUND

In conventional single-bit per cell memory devices, the memory cell assumes one of two information storage states, either an "on" state or an "off" state. The binary condition of "on" or "off" defines one bit of information. As a result, a memory device capable of storing n-bits of data requires (n) separate memory cells.

Increasing the number of bits, which can be stored using single-bit per cell memory devices depends upon increasing the number of memory cells on a one-for-one basis with the number of bits of data to be stored. Methods for increasing the number of memory bits stored in a memory device composed of single-bit capacity cells have relied upon techniques such as manufacturing larger die which contain more memory cells, or using improved photolithography techniques to build smaller memory cells.
Reducing the Size of a Memory Cell Allows More Cells to be Placed on a Given Area of a Single Die.

An alternative to single-bit per cell designs is the storage of multiple-bits of data in a single memory cell. One type of memory in which this approach has been followed is an electrically erasable and programmable device known as a flash memory cell. In flash cells, programming is carried out by applying appropriate voltages to the source, drain, and control gate of the device for an appropriate time period. This causes electrons to tunnel or be injected from a channel region to a floating gate. The amount of charge residing on the floating gate determines the voltage required on the control gate in order to cause the device to conduct current between the source and drain regions. This voltage is termed the threshold voltage, $V_{th}$, of the cell. Conduction represents an "on" or erased state of the device and corresponds to a logic value of one. An "off" or programmed state is one in which current is not conducted between the source and drain regions and corresponds to a logic value of zero. By setting the threshold voltage of the cell to an appropriate value, the cell can be made to either conduct or not conduct current for a given set of applied voltages. Thus, by determining whether a cell conducts current at a given set of applied voltages, the state of the cell (programmed or erased) can be found.

A multiple-bit per cell (MBC) flash memory cell is produced by creating multiple, distinct threshold voltage levels within the device. Each distinct threshold voltage corresponds to a set of data bits. This allows multiple bits of binary data to be stored within the same memory cell. When reading the state of the memory cell, each cell has a binary decoded value corresponding to a value dependant upon the conduction of the cell at its present threshold voltage level. The threshold voltage level for which the cell compares to a sense amplifier having a pre-selected input value indicates the bit set representing the data programmed into the cell. Proper data storage requires that the multiple threshold voltage levels of a MBC memory cell be separated from each other by a sufficient amount so that a level of a cell can be programmed or erased in an unambiguous manner. The relationship between the data programmed into the memory cell and the threshold voltage levels of the cell depends upon the data encoding scheme adopted for the cells.

In programming a MBC memory cell, the objective is to apply a programming voltage over a proper time period to store enough charge in the floating gate to move the threshold voltage to a desired level. This level represents a state of the cell corresponding to an encoding of the data which is to be programmed into the cell. However, dividing of the threshold voltage range for a two state (one bit) cell into multiple threshold voltage levels reduces the margin (threshold voltage difference) between levels. This necessitates tighter system design tolerances and reduced programming operation noise margins so that adjacent levels can be differentiated and programming errors reduced. However, the tightening of the programming and read operation threshold voltage windows has led to slower programming procedures and introduced another potential source of memory system errors.

U.S. Pat. No. 6,937,510 entitled "Non-Volatile Semiconductor Memory", issued Aug. 30, 2005 to Hosono et al. which is hereby incorporated by reference, provides a method and apparatus for programming and reading data from a non-volatile semiconductor device having multiple-bit per cell (MBC) memory cells.

However, this method results in an increase in the number of programming states, which must be traversed, programming time, and power consumption compared to other known methods.

Accordingly, there is a need for the development of an improved an apparatus, method, and system using a MBC memory cell as well as non-volatile memory devices and systems utilizing such improved MBC memory cells.

SUMMARY

It is an object of the present invention to provide an apparatus, method, and system using MBC memory cells that reduce the number of highest programming states used to program a given field of data.

According to one aspect of the present invention there is provided a multiple-bit per cell (MBC) non-volatile memory apparatus that includes a memory array having one or more electrically erasable blocks. The blocks include one or more reprogrammable pages. The reprogrammable pages include upper and lower pages sharing common word-lines. The upper and lower pages include respective upper and lower data fields. The upper and lower data fields include respective virtual upper and lower cells of MBC memory cells. The MBC memory cells have respective threshold voltages programmable to a selected one of first level, second level, third level, or fourth level in order from the lowest voltage level. Programming the lower cells includes programming the respective threshold voltages from the first threshold voltage level to the second threshold voltage level. Programming upper cells includes programming the respective threshold voltages from the first threshold voltage level to the fourth threshold voltage level or from the second threshold voltage level to the third threshold voltage level. The apparatus also includes a controller for writing data to the memory array, wherein the controller selectively inverts data to maximize a number of the bits within a lower page to be programmed and selectively inverts data to minimize a number of bits to be programmed in the respective upper page.

According to another aspect of the present invention there is provided a system that includes a multiple-bit per cell (MBC) non-volatile memory apparatus that includes a memory array including one or more electrically erasable blocks. The blocks include one or more reprogrammable pages. The reprogrammable pages including upper and lower pages sharing common word-lines. The upper and lower pages including respective upper and lower data fields. The upper and lower data fields including respective virtual upper and lower cells of MBC memory cells. The MBC memory cells having respective threshold voltages programmable to selected one of first level, second level, third level, or fourth level in order from the lowest voltage level. Programming the lower cells includes programming the respective threshold voltages from the first threshold voltage level to the second threshold voltage level, and programming upper cells includes programming the respective threshold voltages from the first threshold voltage level to the fourth threshold voltage level or from the second threshold voltage level to the third threshold voltage level. The memory apparatus also includes a controller for writing data to the memory array, wherein the controller selectively inverts data to maximize a number of the bits within a lower page to be programmed and selectively inverts data to minimize a number of bits to be programmed in the respective upper page.

According to still another aspect if the present invention there is provided a system that includes a multiple-bit per cell (MBC) non-volatile memory apparatus that includes a memory array including one or more electrically erasable blocks. The blocks include one or more reprogrammable pages. The reprogrammable pages including upper and lower pages sharing common word-lines. The upper and lower pages including respective upper and lower data fields. The upper and lower data fields including respective virtual upper and lower cells of MBC memory cells. The MBC memory cells having respective threshold voltages programmable to a selected one of first level, second level, third level, or fourth level in order from the lowest voltage level. Programming the lower cells includes programming the respective threshold voltages from the first threshold voltage level to the second threshold voltage level, and programming upper cells includes programming the respective threshold voltages from the first threshold voltage level to the fourth threshold voltage level or from the second threshold voltage level to the third threshold voltage level. The system also includes a controller for writing data to the memory array, wherein the controller selectively inverts data to maximize a number of the bits within a lower page to be programmed and selectively inverts data to minimize a number of bits to be programmed in the respective upper page.

According to another aspect of the invention there is provided a method of programming a lower page and an upper page in a multi-bit per cell (MBC) non-volatile memory, the method includes steps of counting a number of bits having a '0' in a lower data word; inverting all of the bits in the lower data word if the number of '0' bits is less than half of a total number of bits in the lower data word; programming the lower page with the lower data word; counting a number of bits having a '0' in an upper data word; inverting all of the bits in the upper data word if the number of '0' bits is greater than half of a total number of bits in the upper data word; and programming the upper page with the upper data word.

According to yet another aspect of the present invention there is provided a method of reading data in a multi-bit per cell (MBC) non-volatile memory including steps of sensing threshold voltages of MBC cells within a page; providing an upper data word by comparing the threshold voltages to a predetermined voltage reference; and inverting the upper data word if an upper page polarity flag is set.

According to still another aspect of the present invention there is provided a method of reading data in multi-bit per cell (MBC) non-volatile memory including steps of sensing threshold voltages of MBC cells within a page; providing a lower data word by comparing the threshold voltages to two predetermined voltage references; and inverting the lower data word if a lower page polarity flag is set.

In many other publications in this field of art, the terms single level cell (SLC) and multilevel cell (MLC) are used to describe cells capable of storing one binary digit of data or a plurality of binary digits of data respectively. In this disclosure, for clarity, the terms single bit per cell (SBC) and multiple-bit per cell (MBC) are used to describe cells capable of storing one binary digit of data or a plurality of binary digits of data respectively.

It is noted that the representation of binary data can be arbitrarily assigned to a particular range of threshold voltage representing a zero ('0') or a one ('1'). For convenience, the common convention of assigning an erased/unprogrammed cell to represent a '1' and a programmed cell to represent a '0' for an SBC memory cell is used in this disclosure.

Also, in this disclosure, an MBC memory cell for storing M bits per cell has $N=2^M$ possible states (State 1, State 2, . . . State n, . . . State N−1, State N). According to convention, a data value stored in a MEC memory cell by State n is the ones' complement of the binary Grey Code representation of n−1 ($D=d_{M-1}d_{M-2} \ldots d_1 d_0$), wherein $d_0$ to $d_{M-1}$ represent the bits stored in a first page to the $(M-1)^{th}$ page respectively.

In the particular case where M=2 and N=4, the first page and second pages are also referred to as the lower page and upper page respectively. A binary value of '11' is represented by a first range of threshold voltage of an erased memory cell or a first state, a binary value of '10' is represented by a second range of threshold voltage of the memory cell or a second state, a binary value of '00' is represented by a third range of threshold voltage of the memory cell or a third state, and a binary value of '01' is represented by a fourth range of threshold voltage of the memory cell or a fourth state in order from the lowest voltage level.

The present invention therefore provides a non-volatile memory device having tighter distribution of programmed cell threshold voltage ($V_{th}$), reduced power consumption, reduced programming time, and enhanced device reliability compared to the state of the art heretofore.

BRIEF DESCRIPTION OF THE DRAWINGS

Further features and advantages of the present invention will become apparent from the following detailed description, taken in combination with the appended drawings, in which.

It will be noted that throughout the appended drawings, like features are identified by like reference numerals.

DETAILED DESCRIPTION OF THE EMBODIMENTS

Figure 1:
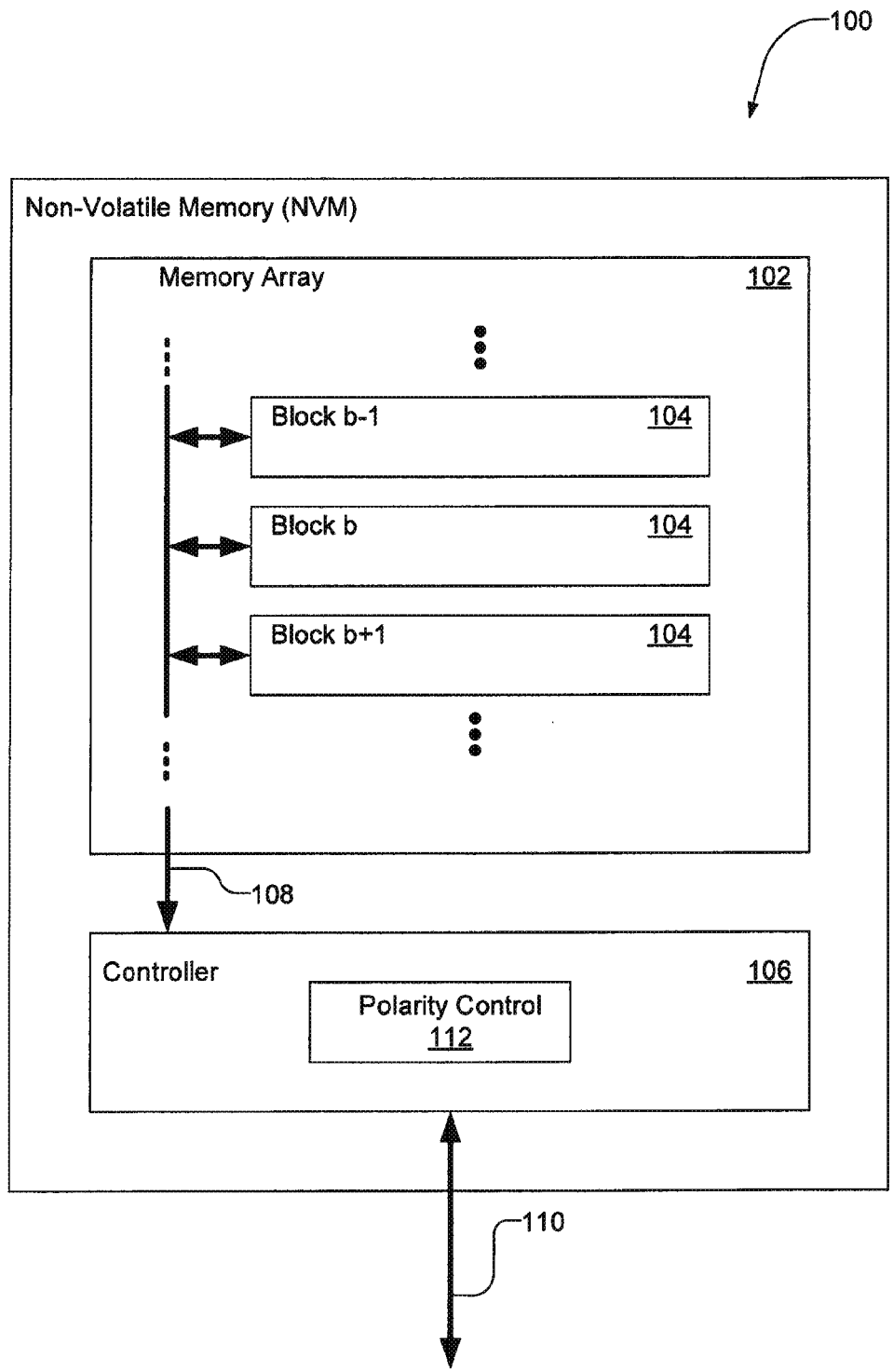
FIG. 1 is a diagram of a non-volatile memory apparatus in accordance with the present invention.

Referring first to FIG. 1, there is shown a diagram of a non-volatile memory (NVM) apparatus 100 in accordance with the present invention. The memory apparatus 100 is preferably a Flash memory but may be any type of EEPROM (Electrically Erasable Programmable Read-Only Memory). The memory apparatus includes at least one memory array 102 that includes one or more memory blocks 104. For the purpose of this disclosure a block is defined as an erasable section of memory.

The memory apparatus 100 also includes a controller 106 for controlling the functions of the memory array such as executing commands received on an interface 110, writing data received on the interface 110 to the memory array 102, reading data from the memory array 102 and providing the data to the interface 110, and erasing data from the blocks 104. The controller 106 includes a polarity control 112 function which will be described in detail herein below. It should be noted that the polarity control 112 may be implemented in hardware, software, firmware, or any combination thereof and still be within the scope of the invention.

For convenience and clarity, interconnect 108 between the memory array 102 and the controller 106 is shown as a simplified schematic representation 108. This interconnect 108 includes conventional memory architecture such as row-decoders, word-lines, bit-lines, column-decoders, page buffers, and sense amplifiers which are well understood by those skilled in the art.

Figure 2:
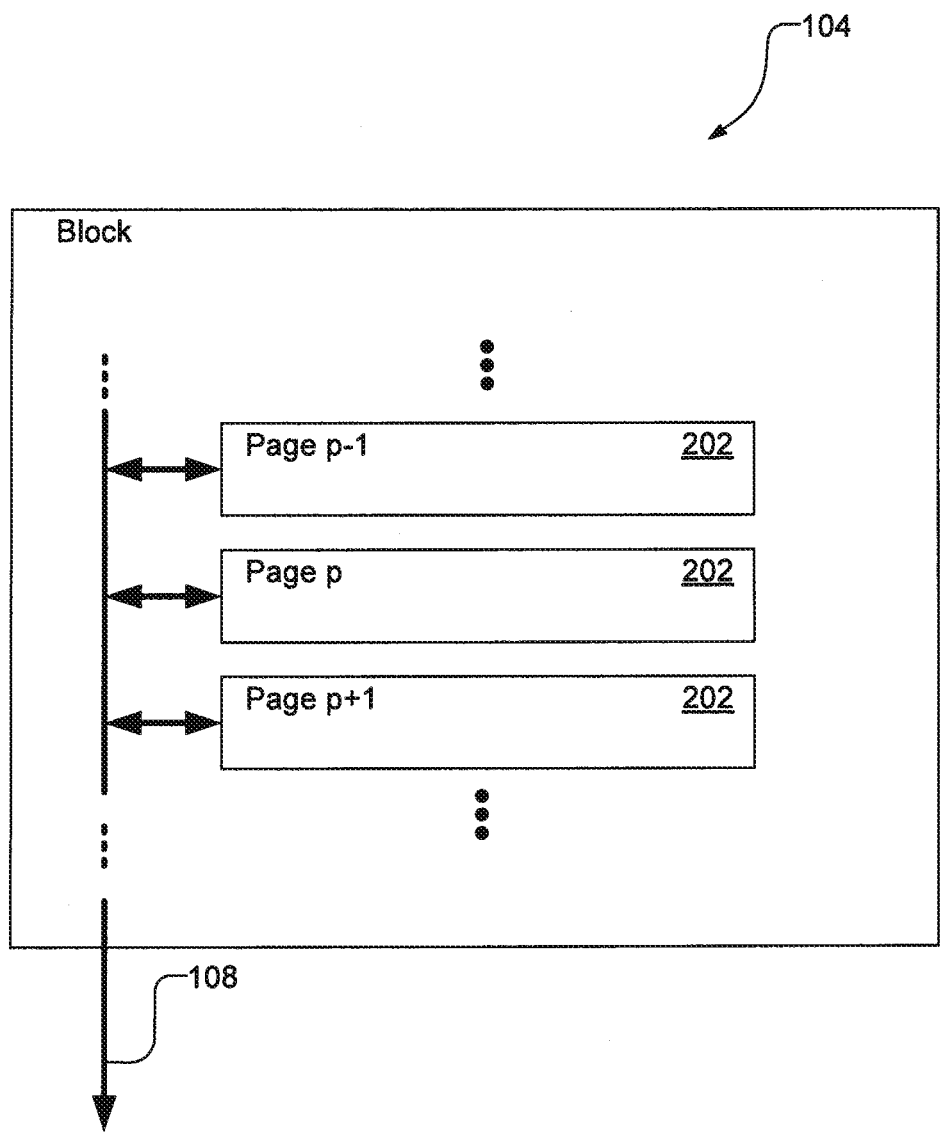
FIG. 2 is a diagram of a block shown in FIG. 1.

Referring to FIG. 2, there is shown further details of the block 104 shown in FIG. 1. The block 104 includes at least one page 202. For the purpose of this disclosure a page is defined as a writable section of memory. A word or data word is defined as binary number that can be stored in a page. The parameter j is defined as the width of a data word/page.

Figure 3:
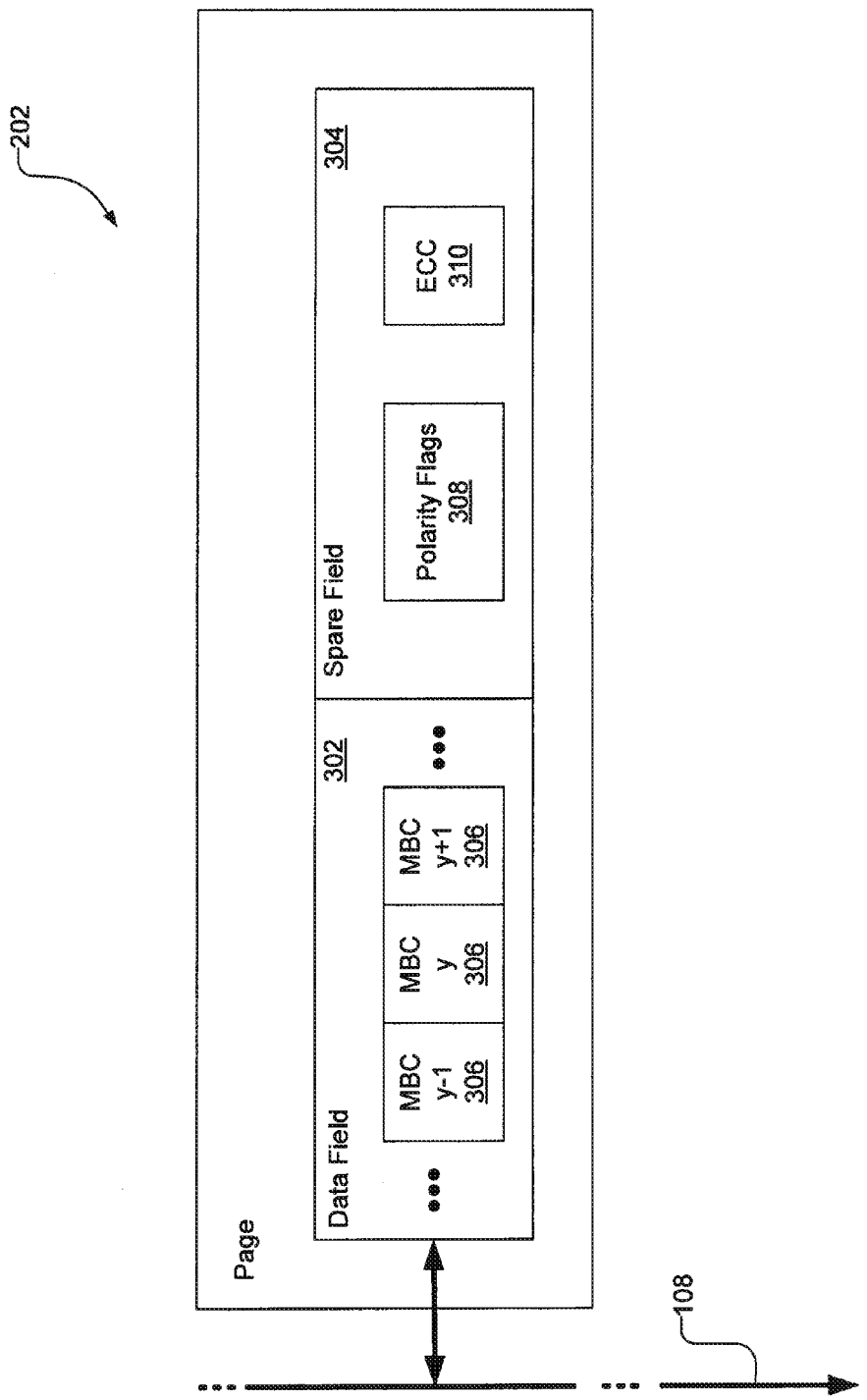
FIG. 3 is a diagram of a page shown in FIG. 2.

Referring to FIG. 3, there is shown further details of a page 202 shown in FIG. 2. The page 202 includes a data field 302 and a spare field 304. The data field 302 includes a plurality of Multi-Bit per Cell (MBC) memory cells 306. The spare field 304 includes a polarity flag 308 that will be described further herein below and a conventional error correction code (ECC) 310.

Figure 4:
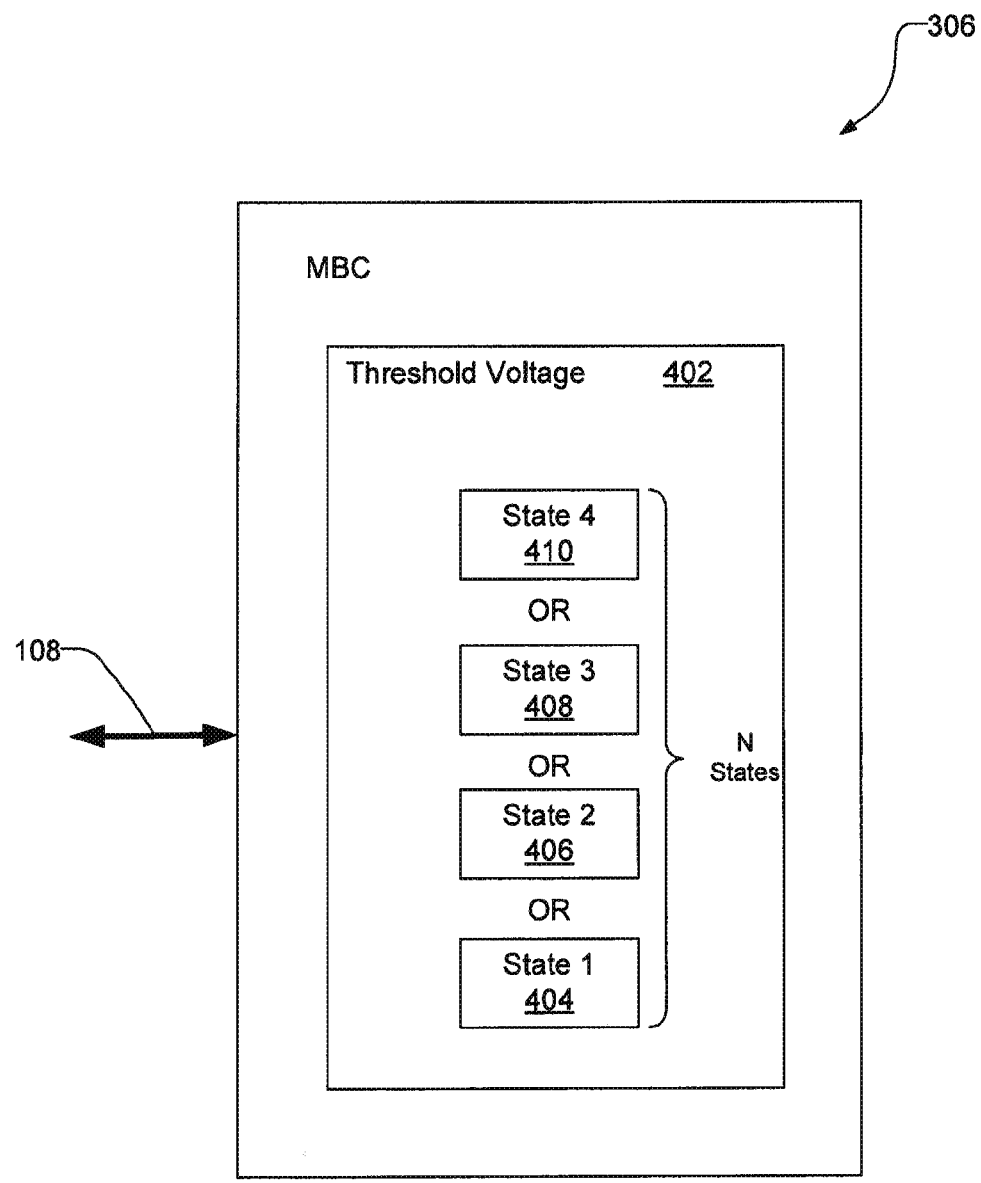
FIG. 4 is a diagram of a Multiple-bit per Cell (MBC) memory cell shown in FIG. 3.

Referring to FIG. 4 there is shown an MBC memory cell shown 306 shown in FIG. 3. A threshold voltage 402 of the MBC memory cell 306 is programmable to one of N predetermined threshold voltages. In this example embodiment N is chosen to be 4. The four predetermined threshold voltages 404,406,408,410 corresponding to states 1 to 4 from the lowest to highest value.

Figure 5:
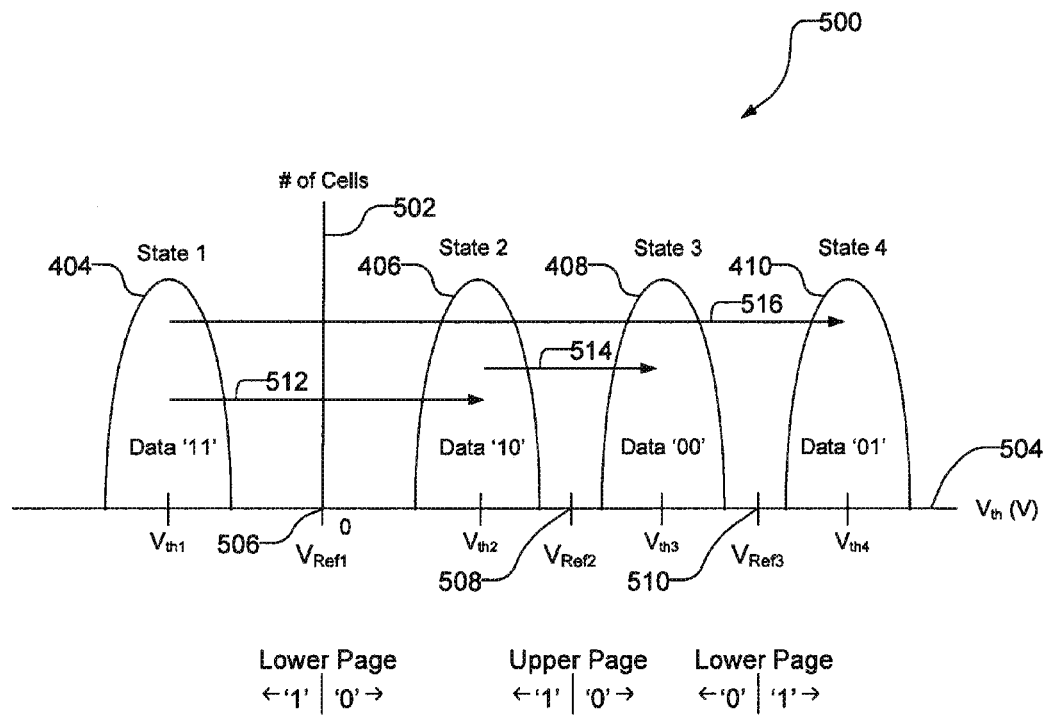
FIG. 5 is a diagram of an example threshold voltage distribution of MBC memory cells shown in FIG. 3.

In FIG. 5 there is shown an example distribution diagram of the threshold voltages 402 of a page 202. The y-axis 502 represents a number of cells programmed to each state 404, 406,408,410 and the x-axis 504 represents threshold voltage (Volts) corresponding to each state 404,406,408,410. In this example, the MBC memory cells 202 are about evenly distributed over the four predetermined threshold voltages 404, 406,408,410. The threshold voltages preferably have a small deviation from the ideal predetermined values and have enough margin from adjacent reference voltages $V_{Ref1}$, $V_{Ref2}$, $V_{Ref3}$ 506,508,510 to provide reliable operation. The asymmetrical predetermined reference voltages 506,508,510 is one example of conventional threshold voltage scheme. The present invention is also applicable to other threshold voltage schemes such as the scheme described in applicant's co-pending U.S. application no.: 2008/0062760, titled: "FLASH MULTI-LEVEL THRESHOLD DISTRIBUTION SCHEME", by Kim, Filed: Jun. 13, 2007, which is hereby incorporated by reference.

Figure 6:
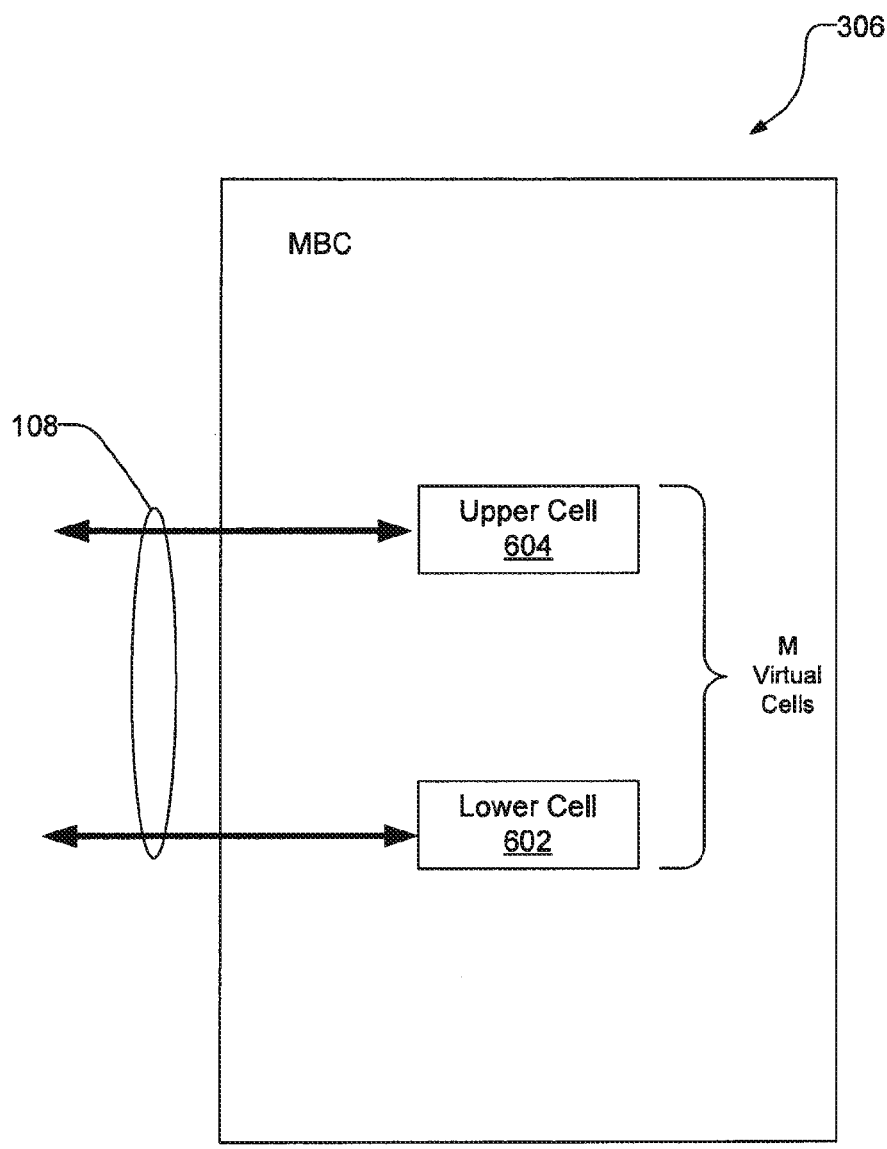
FIG. 6 is a diagram showing an alternative representation of the MBC memory cell shown in FIG. 4.

The representation of the MBC cell 306 shown in FIG. 4 is a schematic representation physical hardware. Alternatively, the MBC cell 306 can be represented as shown in FIG. 6. In this example, the four states 404,406,408,410 of the MBC memory cell 306 are represented as two virtual SBC (single bit per cell) cells 602,604 each having one bit per cell. In general, where the number of states in a MBC memory cell is N, the number of virtual cells having one bit per cell is $M=\log_2 N$ and N is preferably chosen to be an integer power of 2. In the embodiment described here, N=4 and M=2. The lower cell 602 and an upper cell 604 are addressable using two different row-addresses.

Figure 7:
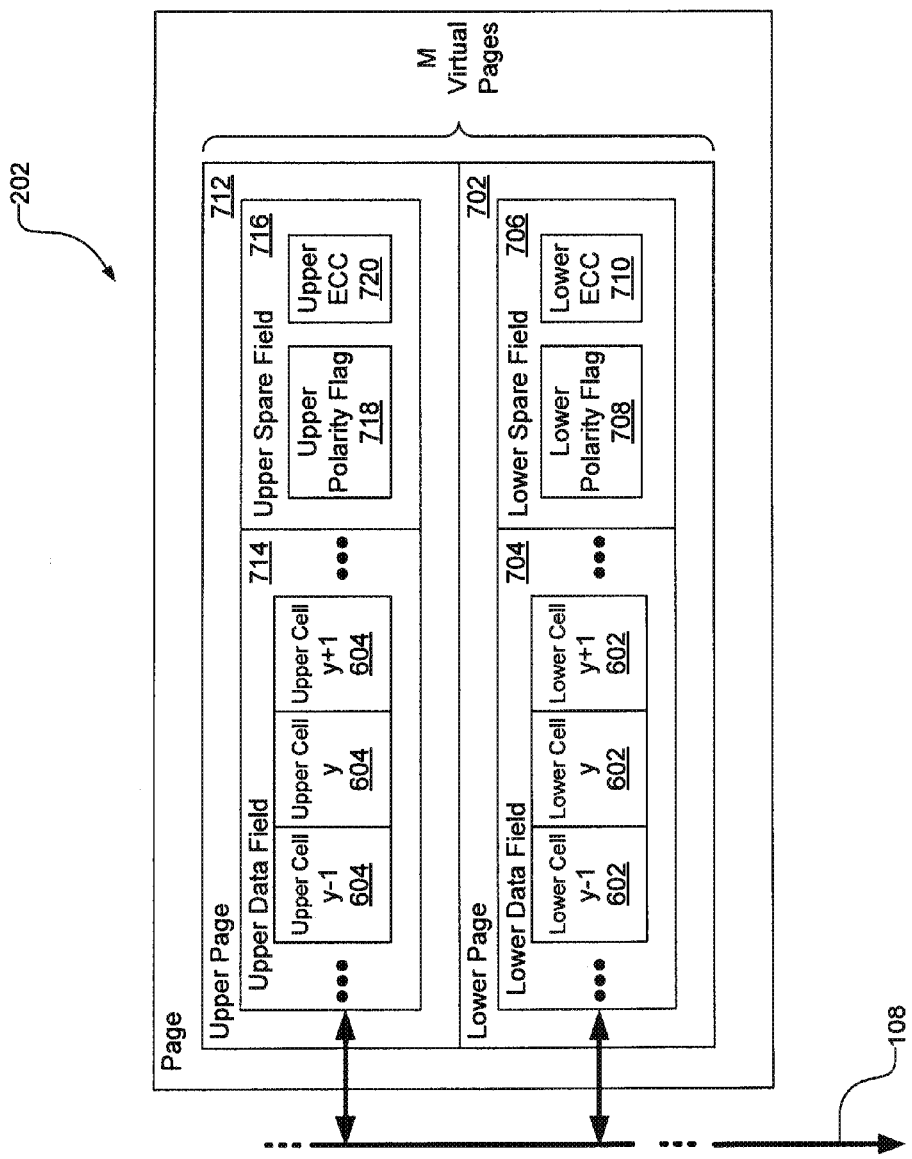
FIG. 7 is a diagram showing a alternative representation of the page shown in FIG. 3.

Furthermore, as shown in FIG. 7, the page 202 shown in FIG. 3 can be represented as including a virtual lower page 702 and a virtual upper page 712 which can be addressed independently using the two different row-addresses. The lower page 702 and upper page 712 include a respective lower data field 704 and upper data field 714 as well as a respective lower spare field 706 and upper spare field 716. The lower data field 704 and upper data field 714 include a respective plurality (j) of lower cells 602 and upper cells 604. The lower spare field 706 and upper spare field 712 include a respective lower page polarity flag 708 and upper page polarity flag 718 as well as a respective lower ECC 710 and upper ECC 720.

Furthermore still, plurality of lower pages 702 within a block 102 may be referred to as an lower plane (not shown) and a plurality of upper pages 712 within a block 102 may be referred to as an upper plane (not shown). This is known as a dual-plane or more generally a multi-plane architecture in the art wherein each plane can be addressed independently even though physically sharing the same row-decoders, word-lines, and cells.

When a block 104 is erased, all MBC memory cells 306 in the block are set to State 1 404. State 1 404 corresponds to cells that have been erased and are assigned the data value '11' by convention. State 2 406 corresponds to a data value of '10', State 3 408 corresponds to a data value of 'C0', and State 4 410 corresponds to a data value of '01'.

Programming (storing a '0') the lower cell 602 includes steps of programming the MBC cell 306 from State 1 404 to State 2 406. Programming the upper cell 604 includes steps of programming the MBC cell 306 from State 1 404 to State 4 410 or from State 2 406 to State 3 408.

In general, programming the $m^{th}$ cell of the M virtual cells includes steps of programming the MBC cell 306 from one of states $1, 2, \ldots$ to $2^{m-1}$ to one of states $2^m, 2^m-1, \ldots$ to $2^{m+1}+1$ respectively.

Figure 8A:
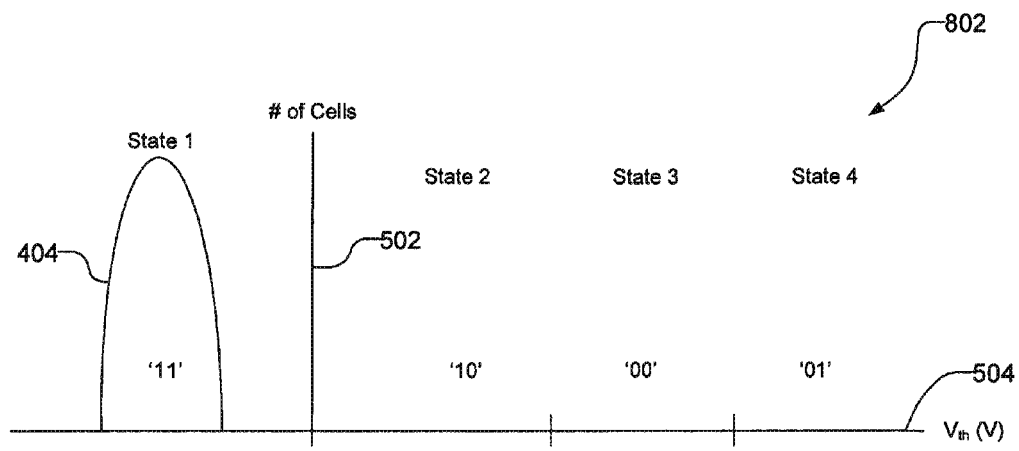
FIGS. 8a to 8c are diagrams of example threshold voltage distributions of MBC memory cells of the page shown in FIG. 3.
Figure 8B:
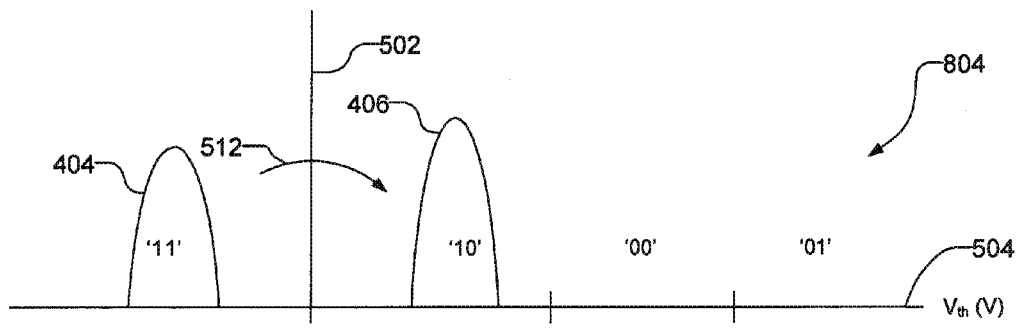
Figure 8C:
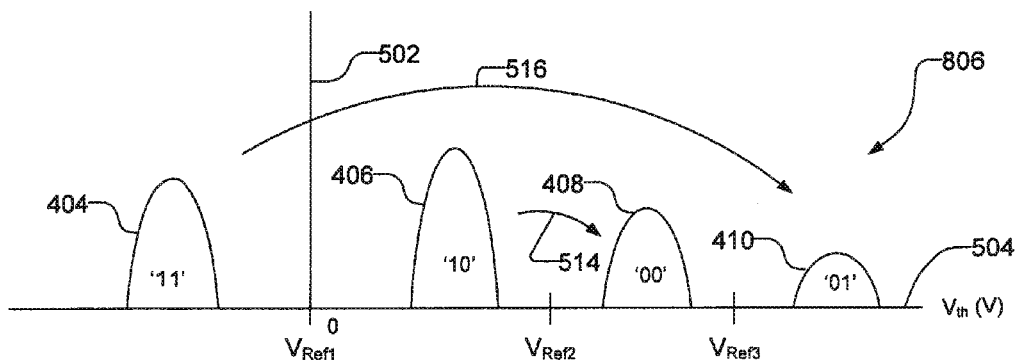

FIG. 8a to 8c show example distributions 802,804,806 of a page 202 after erase and write operations. In FIG. 8a all of the cells 306 are in State 1 404 after being erased. In FIG. 8b there is shown a distribution 804 after the lower data field 704 has been programmed 512 with a data word wherein the data word has a different number of '0's than '1's. Note, as described further herein below, more cells 306 are programmed 512 to State 2 406 than left in State 1 404. In FIG. 8c there is shown a distribution 806 after the upper data field 714 has been programmed 514,516 with a data word wherein the data word has a different number of '0's than '1's. Note, as further described herein below, fewer cells 306 are programmed 514,516 to States 3 and 4 408,410 from States 2 and 1 406,404 respectively. It should also be noted that State 4 410 in FIG. 8c has the lowest number of cells when compared to States 1 to 3 404,406,408.

Figure 9:
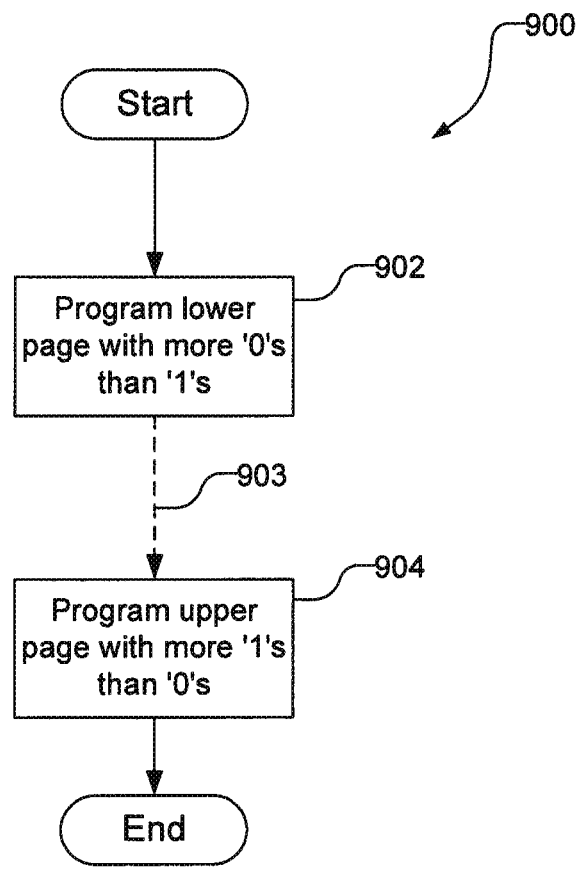
FIG. 9 is a flowchart of a method of programming data words into a lower page and an upper page in accordance with the present invention.

In FIG. 9 there is shown a flow chart 900 of a method of programming data words into a lower page 702 and an upper page 712 in accordance with the present invention. The method includes a step 902 for programming a lower page 702 with more '0's than '1's by selectively inverting the data word to be programmed into the lower page 702; and a step 904 for programming an upper page 712 with more '1's than 'Q's by selectively inverting the data word to be programmed into the upper page 712. It should be noted that a dotted line 903 between steps 902 and 904 means that in is not necessary to program an upper page 712 immediately after programming the corresponding lower page 702. For example, a plurality of lower pages 702 within a block 104 may be programmed before the corresponding upper pages 712 are programmed and still be within the scope of the invention.

Figure 10:
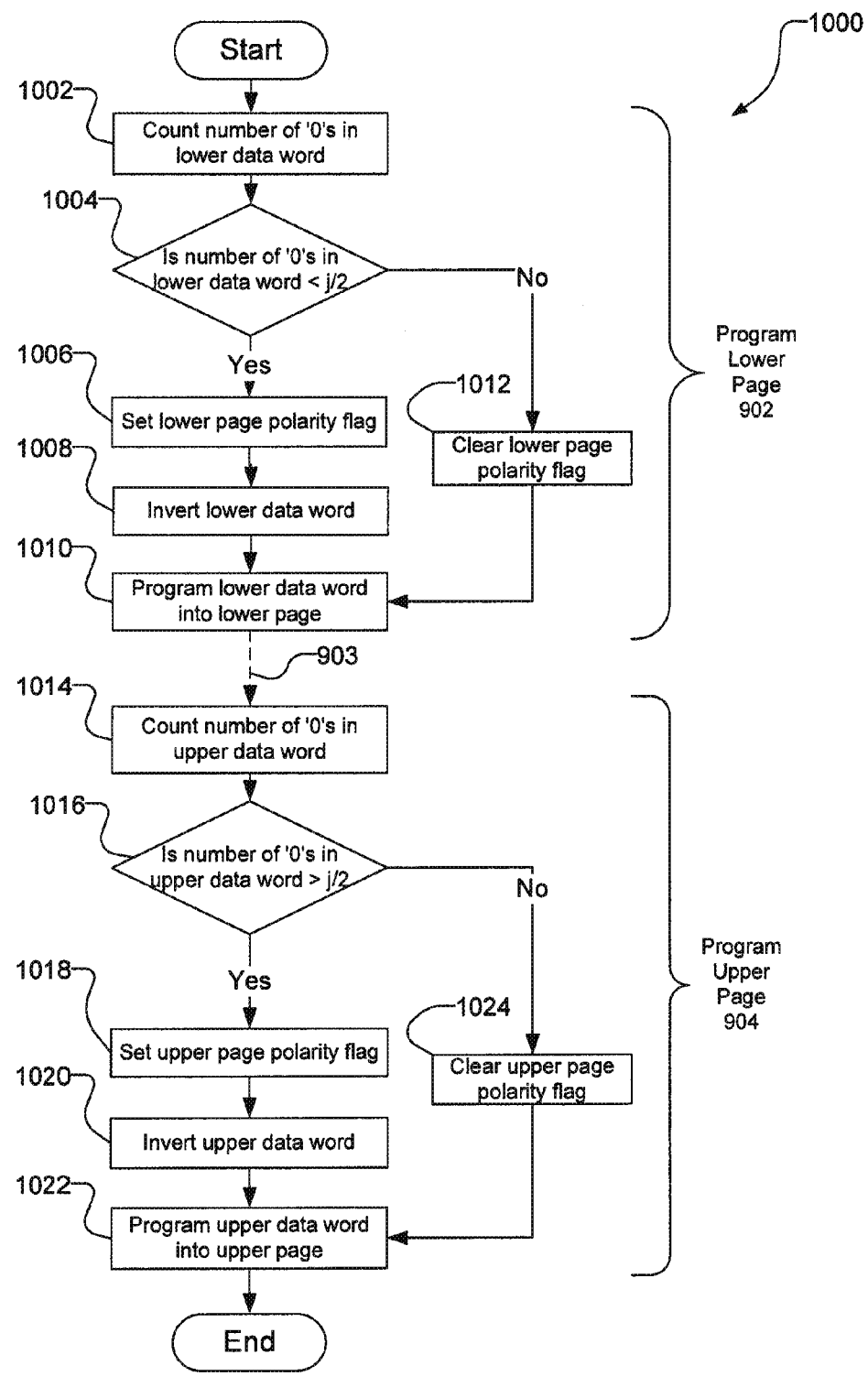
FIG. 10 is a more detailed flowchart of the method shown in FIG. 9.

FIG. 10 is a more detailed flowchart 1000 of the method depicted by the flowchart 900 shown in FIG. 9. The step of programming the lower page 902 includes steps of counting 1002 a number of '0's in a data word to be programmed into the lower page 702; deciding 1004 if the lower data word has fewer '0's than '1's or alternatively less than j/2 (half the word/page width); if yes, setting 1006 a lower page polarity flag 708, and inverting 1008 the lower data word; if no, clearing 1012 the lower page polarity flag 708; and programming 1010 the lower data word into the lower page 702 (described in further detail herein below). The step of programming the upper page 904 includes steps of: counting 1014 a number of '0's in a data word to be programmed into the upper page 712; deciding 1016 if the upper data word has more '0's than '1's or alternatively greater than j/2; if yes, setting 1018 an upper page polarity flag 718, and inverting 1020 the upper data word; if no, clearing 1024 the upper page polarity flag 718; and programming 1010 the upper data word into the upper page 712 (described in further detail herein below).

Figure 11:
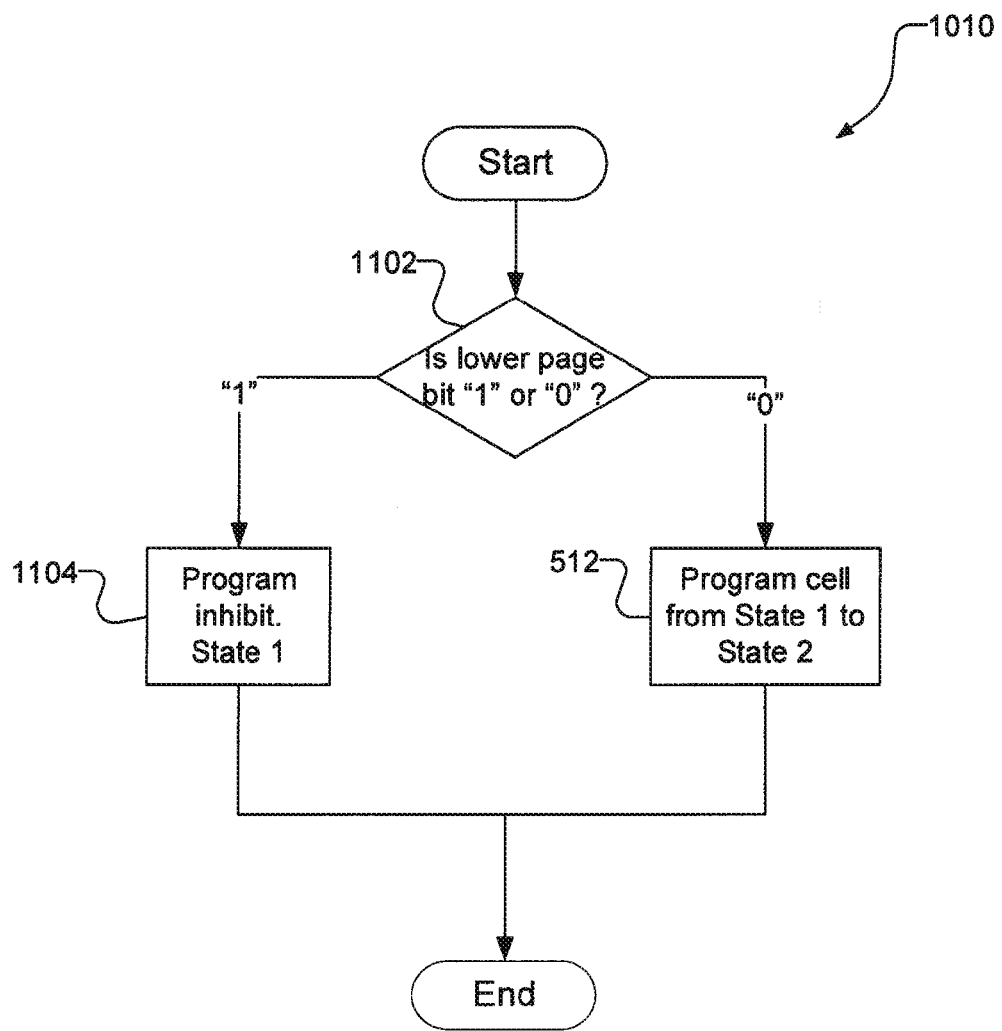
FIGS. 11 and 12 are flowcharts of steps in the method shown in FIG. 10.

FIG. 11 is a flowchart of the step 1010 for programming the lower data word into the lower page 702 of the method depicted by the flowchart 1000 shown in FIG. 10. For each bit in the data word to be programmed 1102, if the data bit is a '1' then inhibit programming 1104 or leave it in State 1 404; if the data bit is a '0' then program 512 the cell from State 1 404 to State 2 406.

Figure 12:
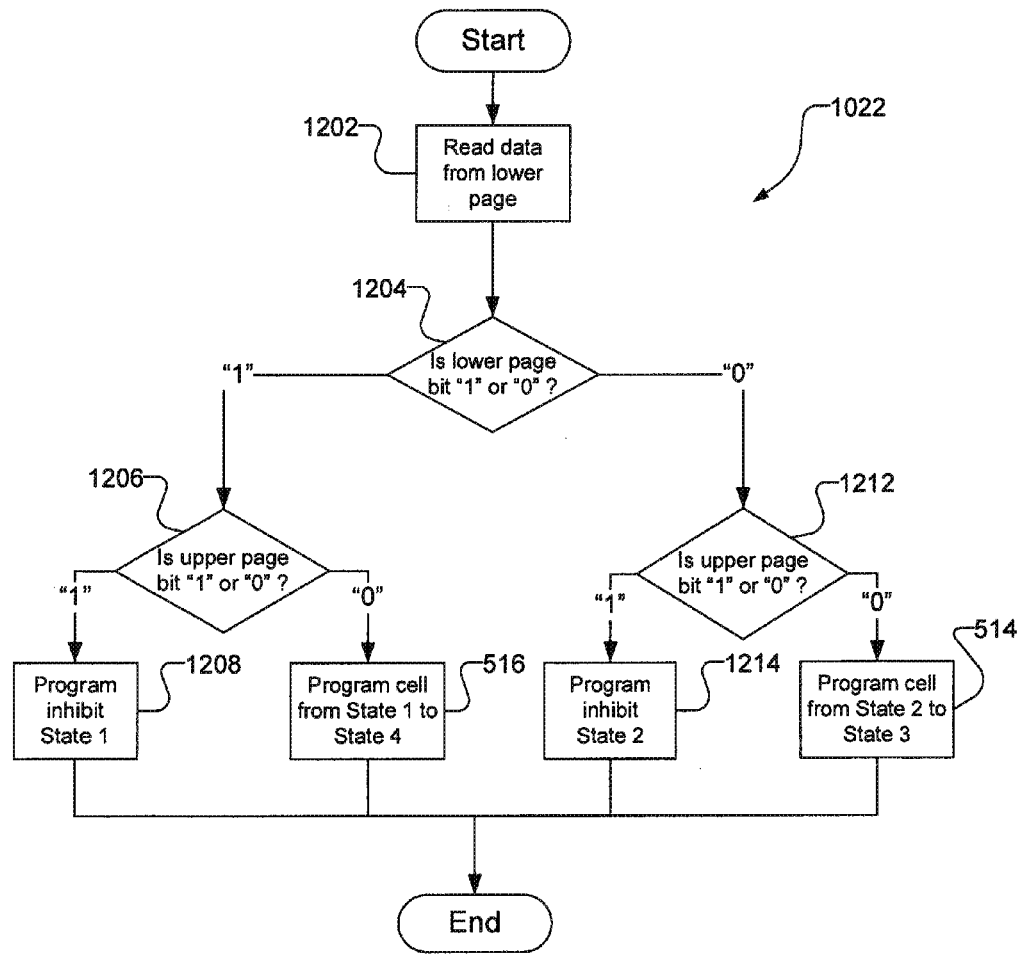

FIG. 12 is a flowchart of the step 1022 for programming the upper data word into the upper page 712 of the method depicted by the flowchart 1000 shown on FIG. 10. First, a lower data word is read from the lower page 702 sharing the same word-line as the upper page 712. Then for each bit in the lower data word and upper data word, if the upper/lower data bits are '11' 1204,1206 then programming is inhibited 1208 and the cell remains in State 1 404; if the upper/lower data bits are '10' 1204,1206 then the cell is programmed 516 from State 1 406 to State 4 410; if the upper/lower data bits are '01' 1204,1212 then programming is inhibited 1214 and the cell remains in State 2 406; else if the upper/lower data bits are '00' 1204,1206 the cell is programmed 514 from State 2 406 to State 3 408.

Figure 13:
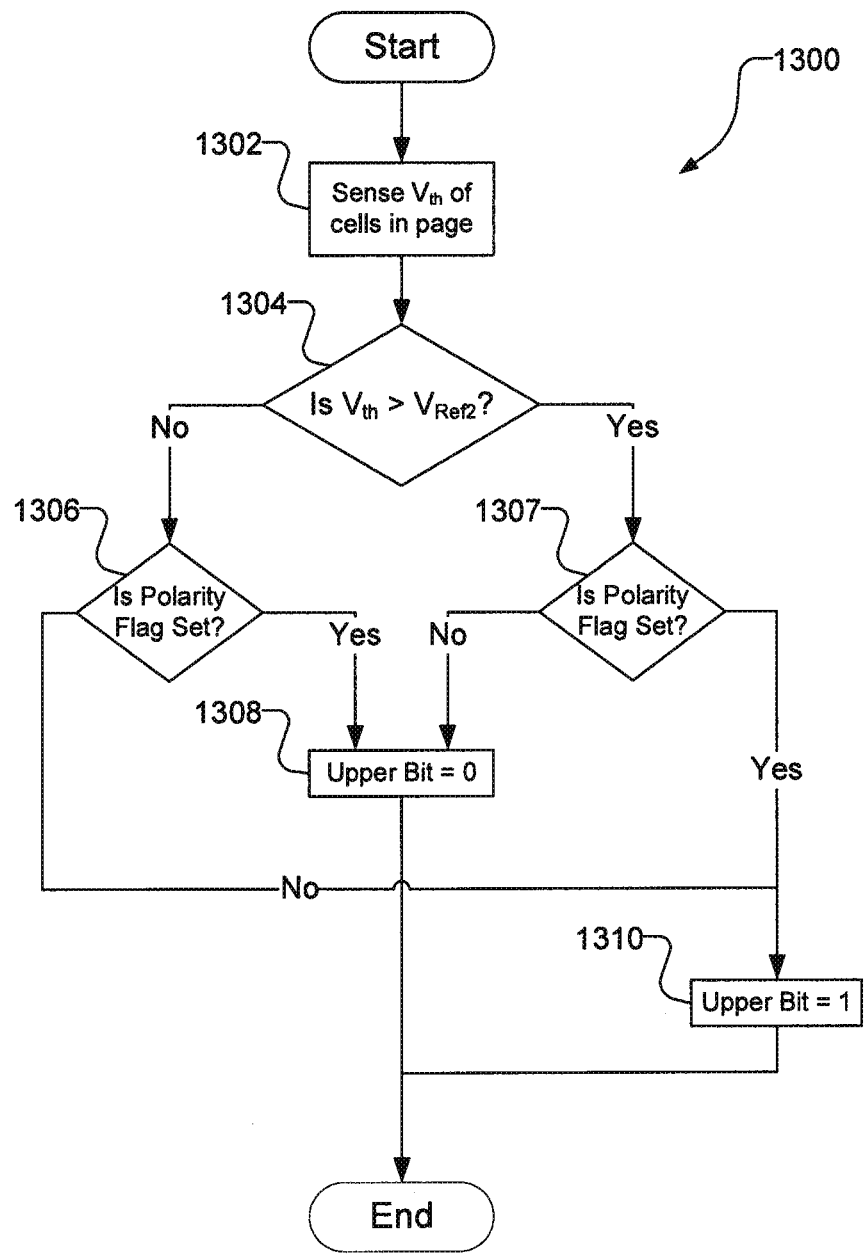
FIGS. 13 and 14 are flowcharts of methods of reading data in accordance with the present invention.

FIG. 13 is a flowchart 1300 of a method of reading data from an upper page 712 in accordance with the present invention. First, a threshold voltage 402 is sensed 1302 from each cell 306 in the page 202; if the threshold voltage is not greater than $V_{Ref2}$ 1304 and the polarity flag is not set 1306 then the upper bit is a '1' 1310; if the threshold voltage is not greater than $V_{Ref2}$ 1304 and the polarity flag is set 1306 then the upper bit is a '0' 1308; if the threshold voltage is greater than $V_{Ref2}$ 1304 and the polarity flag is not set 1307 then the upper bit is a '0' 1308; else if the threshold voltage is greater than $V_{Ref2}$ 1304 and the polarity flag is set 1307 then the upper bit is a '1' 1310.

Figure 14:
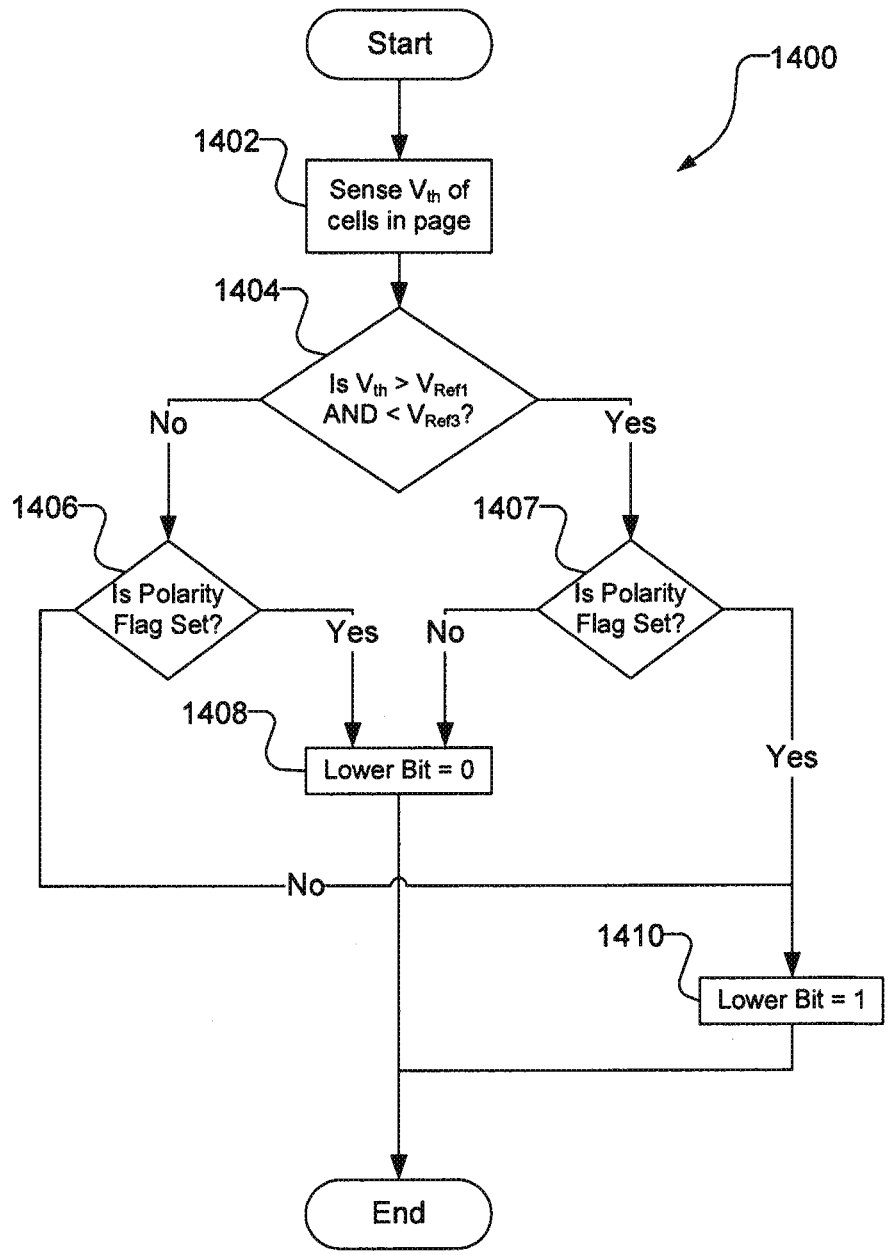

FIG. 14 is a flowchart 1400 of a method of reading data from a lower page 702 in accordance with the present invention. First, a threshold voltage 402 is sensed 1402 from each cell 306 in the page 202; if the threshold voltage is less than $V_{Ref1}$ or greater than $V_{Ref3}$ 1404 and the polarity flag is not set 1406 then the lower bit is a '1' 1410; if the threshold voltage is less than $V_{Ref1}$ or greater than $V_{Ref3}$ 1404 and the polarity flag is set 1406 then the upper bit is a '0' 1408; if the threshold voltage is greater than $V_{Ref1}$ and less than $V_{Ref3}$ 1404 and the polarity flag is not set 1407 then the upper bit is a '0' 1408; else if the threshold voltage is greater than $V_{Ref1}$ and less than $V_{Ref3}$ 1404 and the polarity flag is set 1407 then the upper bit is a '1' 1410.

In general, a threshold voltage of the MBC cell is sensed in a conventional manner, if the sensed threshold voltage is less than $V_{Ref1}$ then the value stored is N−1 (all '1's, or ones' complement of Grey code representation of 0), if the sensed threshold voltage is between $V_{Ref(n-1)}$ and $V_{Refn}$ then the value stored in the MBC cell is the ones' complement of the Grey code representation of n−1, and if the sensed threshold voltage of the MBC memory cell is greater than $V_{Ref(N-1)}$ then the value stored is the ones' complement of the Grey code representation of N−1. Furthermore, if a corresponding polarity flag is set then the value read from the MEC cell is inverted.

The M virtual pages can be read from the $M^{th}$ page to the first page sequentially in order. For reading the $M^{th}$ page the threshold voltages are compared to $V_{Ref(2^{M-1})}$; then for reading the $(M-1)^{th}$ page the threshold voltages are compared to $V_{Ref(2^{M-2})}$ and $V_{Ref3(2^{M-2})}$; then for reading the $(M-2)^{th}$ page the threshold voltages are compared to $V_{Ref(2^{M-3})}$, $V_{Ref3(2^{M-3})}$, $V_{Ref5(2^{M-3})}$, and $V_{Ref7(2^{M-3})}$; and so on until the first where the threshold voltages are compared to $V_{Ref1}$, $V_{Ref3}$, $V_{Ref5}$, ... $V_{Ref(N-1)}$.

Figure 15:
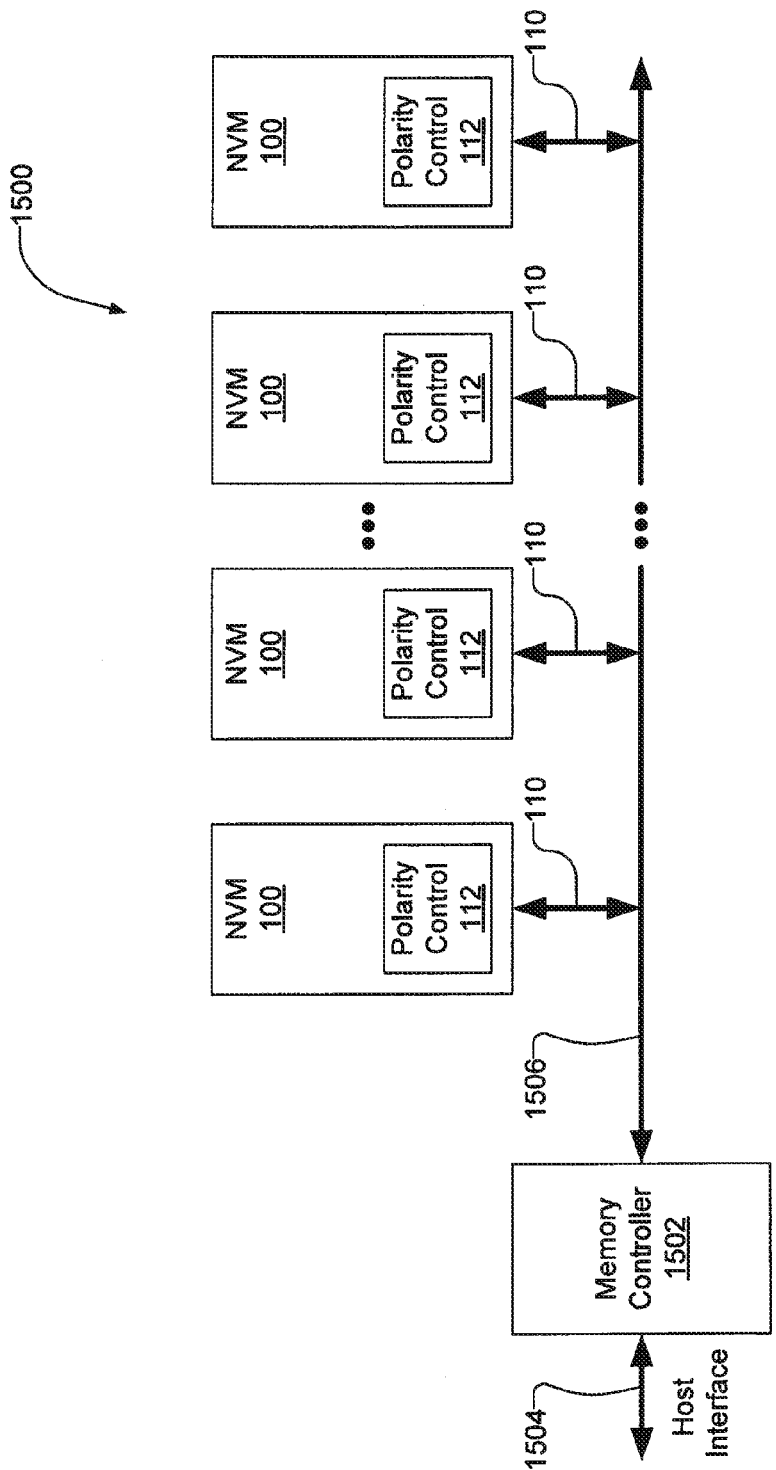
FIG. 15 is a diagram of a memory system including the non-volatile memory apparatus shown in FIG. 1 in accordance with the present invention.

FIG. 15 is a diagram of a memory system 1500 in accordance with the present invention. The system 1500 includes a memory controller, 1502 that has a host interface 1504 and a parallel bus interface for connecting to one or more nonvolatile memories 100 having polarity control 112 as described herein above.

Figure 16:
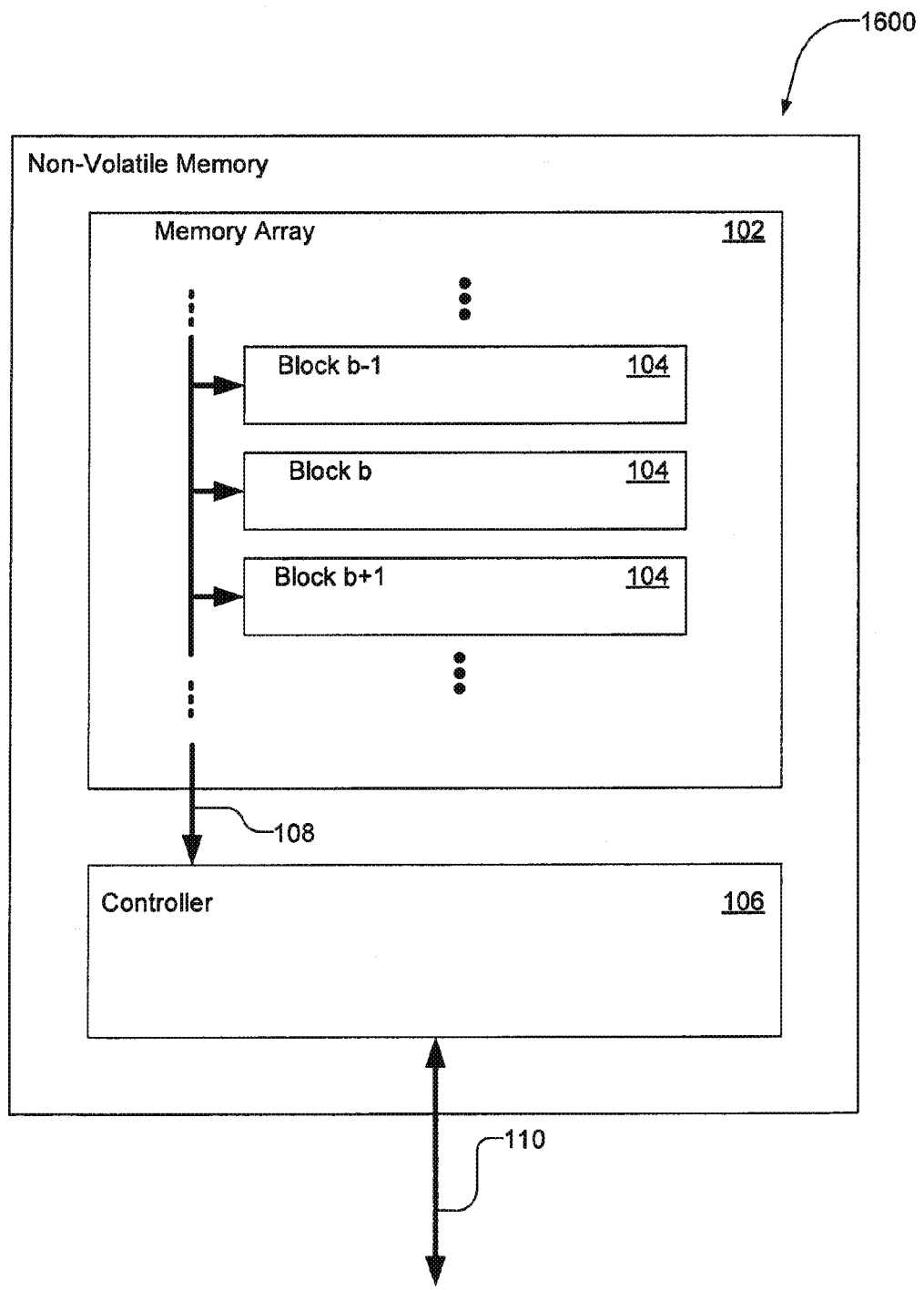
FIG. 16 is a diagram of a non-volatile memory apparatus in accordance with the present invention.
Figure 17:
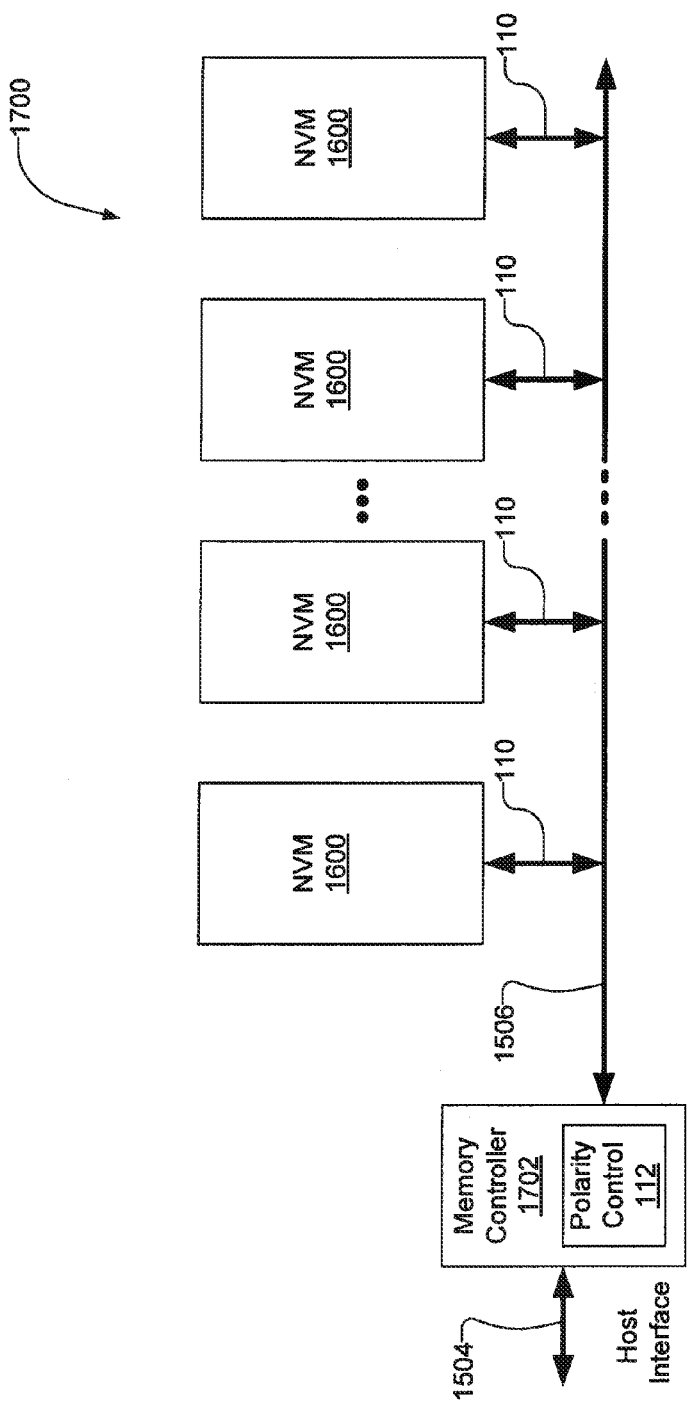
FIG. 17 is a diagram of a memory system including the non-volatile memory apparatus shown in FIG. 16 in accordance with the present invention.

Referring next to FIGS. 16 and 17 there is shown another non-volatile memory apparatus 1600 and system 1700 in accordance with the present invention wherein a controller 106 is adapted to communicate over a system bus 1506 with a memory controller 1702 having polarity control 112.

Figure 18:
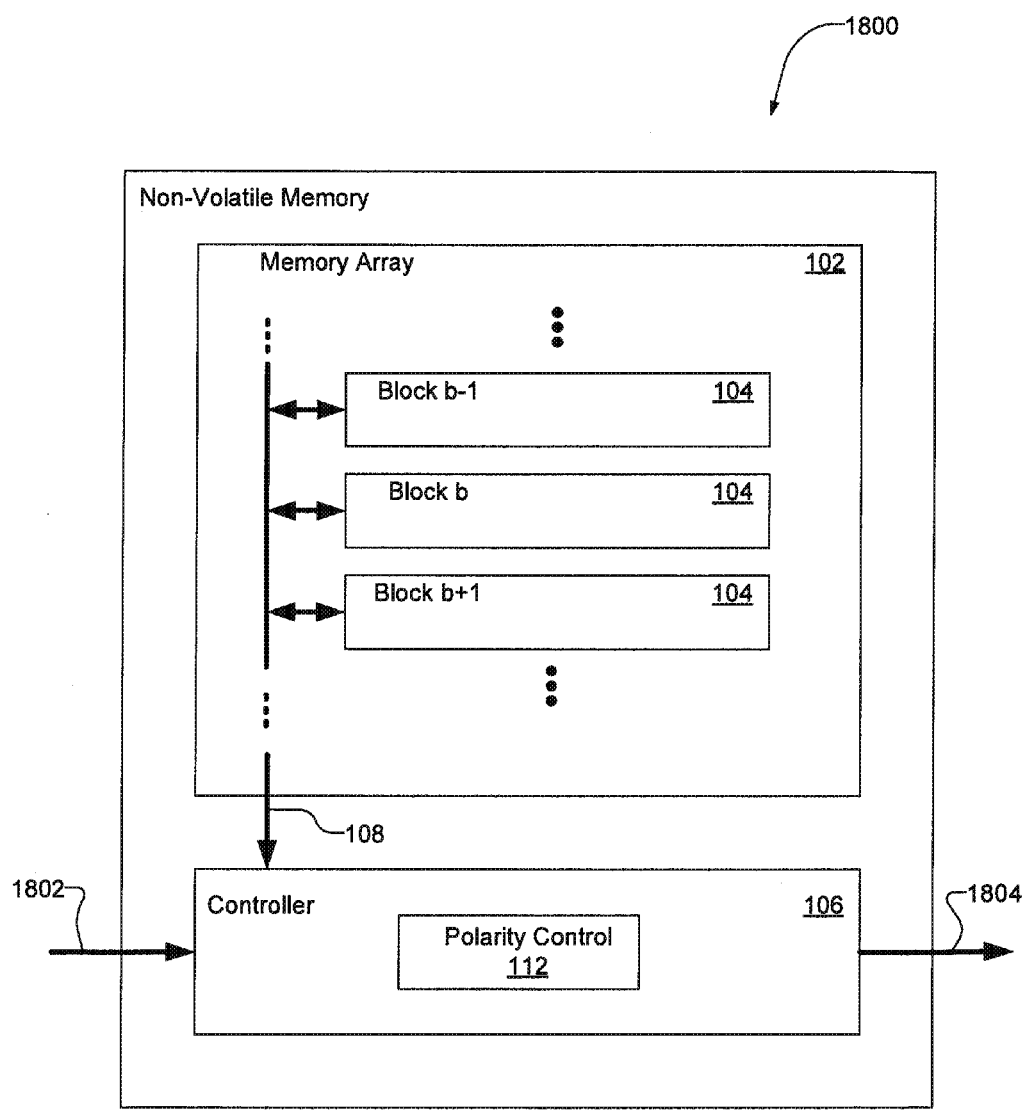
FIG. 18 is a diagram of a non-volatile memory apparatus in accordance with the present invention.
Figure 19:
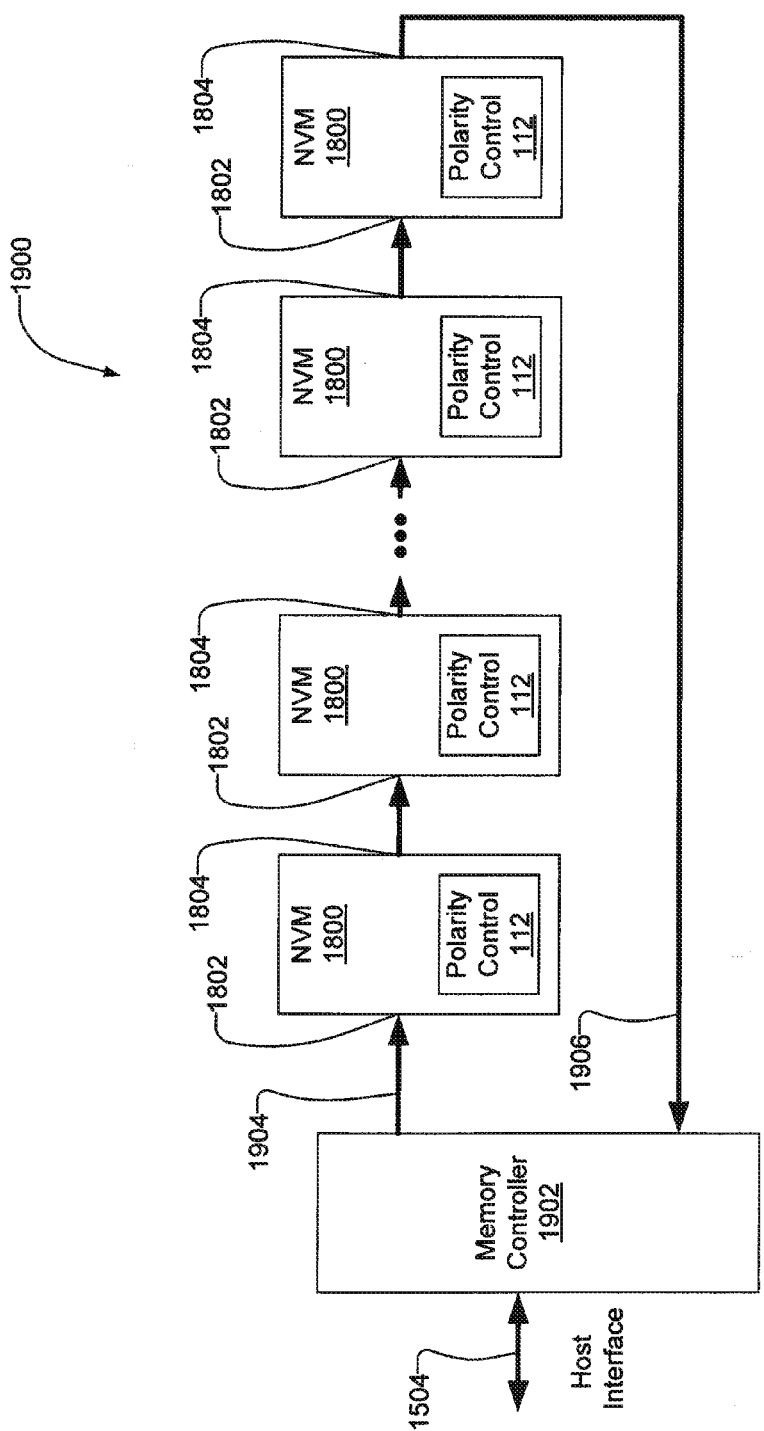
FIG. 19 is a diagram of a memory system including the non-volatile memory apparatus shown in FIG. 18 in accordance with the present invention.

In FIGS. 18 and 19 there is shown another non-volatile memory apparatus 1800 and system 1900 in accordance with the present invention. The non-volatile memory apparatus 1800 is substantial the same as the one 100 shown in FIG. 1, except that it has a serial input 1802 and a serial output 1804 instead of a parallel interface 110. The memory system 1900 includes one or more of the non-volatile memory apparatus 1800 shown in FIG. 18. A memory controller 1902 having a host interface 1504, a serial output 1904 and a serial input 1906 controls the memory system 1900 in a manner, for example, as described in applicant's co-pending U.S. application titled: "MULTIPLE INDEPENDENT SERIAL LINK MEMORY", Ser. No. 11/324,023, filed: Dec. 30, 2005 by Kim et al which is hereby incorporated by reference.

Figure 20:
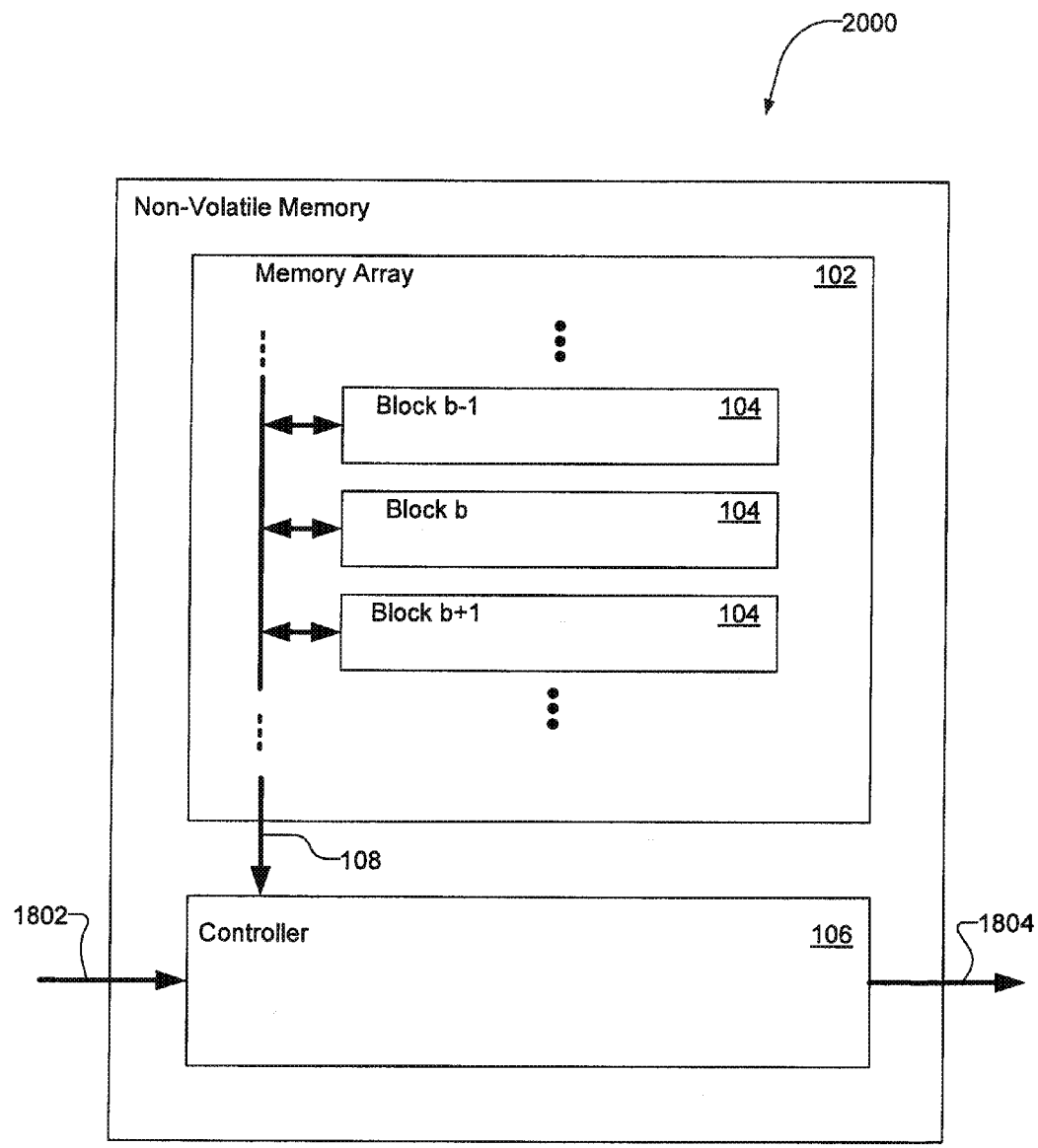
FIG. 20 is a diagram of a non-volatile memory apparatus in accordance with the present invention.
Figure 21:
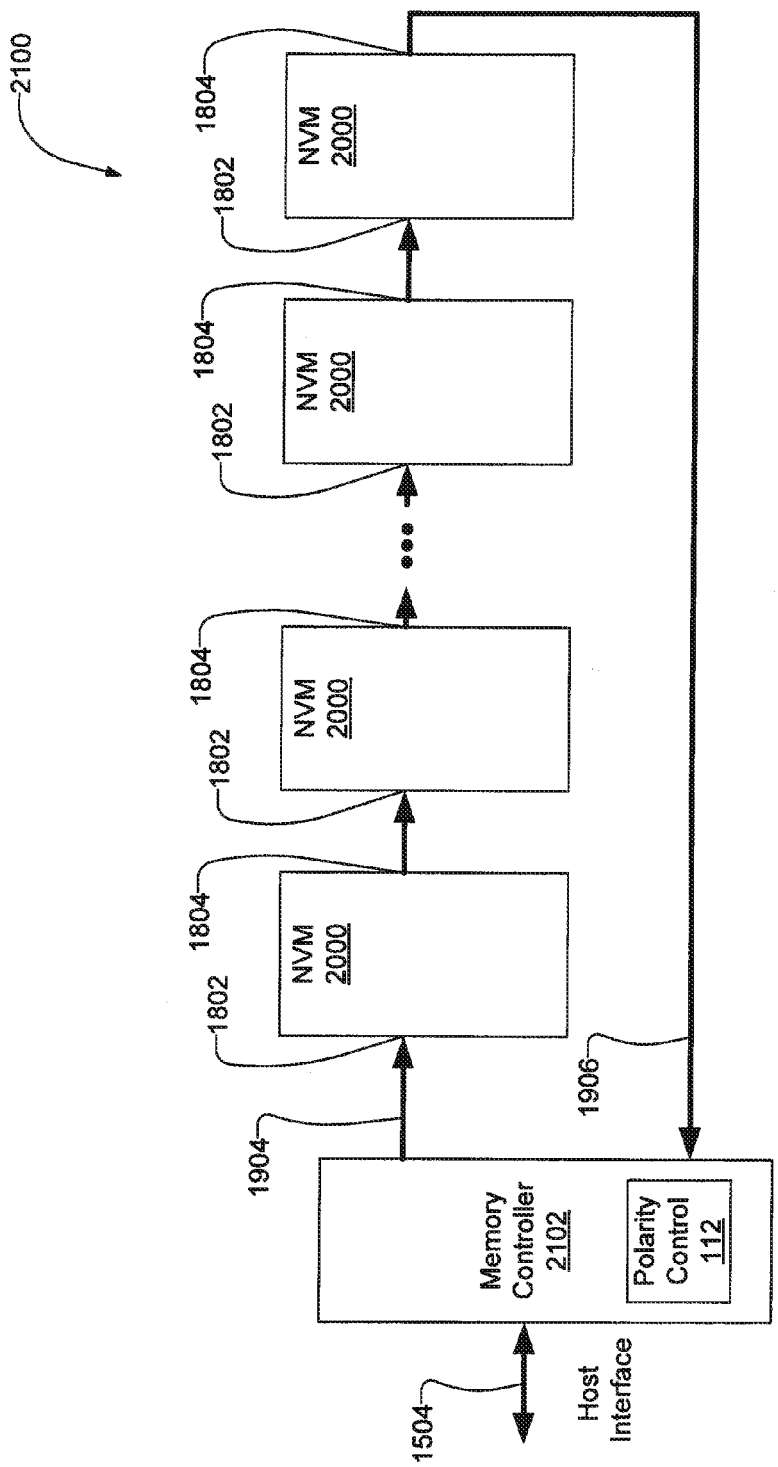
FIG. 21 is a diagram of a memory system in accordance with the present invention including the non-volatile memory apparatus shown in FIG. 20 in accordance with the present invention.
Figure 22A:
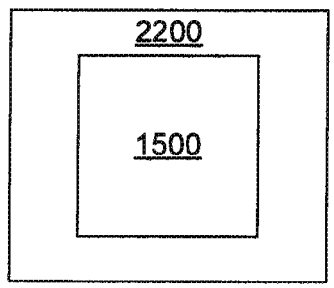
FIGS. 22A to 22D are diagrams of electric devices including the memory systems shown in FIGS. 15, 17, 19, and 21 respectively.
Figure 22B:
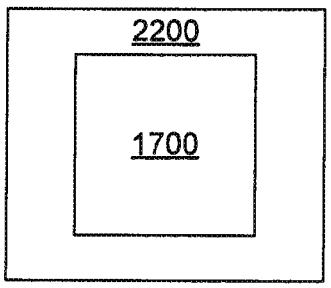
Figure 22C:
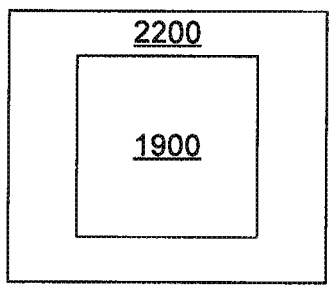
Figure 22D:
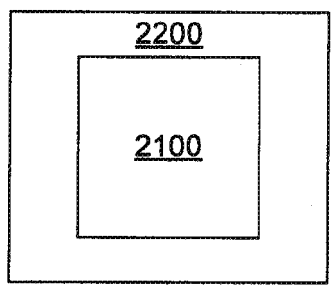

FIGS. 20 and 21 show another non-volatile memory apparatus 2000 and system 2100 in accordance with the present invention wherein a controller 106 is adapted to communicate over a serial bus 1904,1906 with a memory controller 2102 having polarity control 2104. The non-volatile memory apparatus 2000 is substantial the same as the one 1600 shown in FIG. 16, except that it has a serial input 1802 and a serial output 1804 instead of a parallel interface 110. The memory system 2100 includes one or more of the non-volatile memory apparatus 2000 shown in FIG. 20. A memory controller 2102 having a host interface 1504, a serial output 1904 and a serial input 1906 controls the memory system 2100 in a manner, for example, as described in application Ser. No. 11/324,023, supra.

It should be noted that while embodiments of system having parallel interfaces (FIGS. 15 and 17) and serial interfaces (FIGS. 19 and 21), systems having any combination of parallel and serial interfaces are also within the scope of the invention.

While embodiments including MBC memory cells having 2 bits per cell have been described, the present invention is also applicable to apparatus, methods, and systems including MBC memory cells having greater than 2 bits per cell.

In general, referring again to FIG. 4, an MBC memory cell 306 having M bits per cell includes N states (State 1, State 2, ... State n, ... State N-1, State N) from the lowest to the highest value of $V_{th}$ in order, wherein, see FIG. 5, State n represents a data value (D) that is a 1's complement of the Gray Code value of n-1 (n=1 to N), and wherein the LSB (least significant bit) of D to the MSB (most significant bit) of D represent data stored in virtual cells. Programming the $M^{th}$ bit of D into the $m^{th}$ virtual cell includes programming the MBC memory cell from one of states 1, 2, ... $2^{m-1}$ to one of states $2^m$, $2^m-1$, ... $2^{m+1}+1$ respectively.

A controller selectively inverts polarity of data to be programmed to maximize a number of bits to be programmed within each one of pages 1 to M-1 and selectively inverts the polarity of the data to be programmed to minimize a number of bits to be programmed within the $M^{th}$ page.

As described herein above the memory systems shown in FIGS. 15, 17, 19, and 21 may also be embedded, as shown in FIGS. 22A, 22B, 22C, and 22D respectively, in an electric device 2200. The electric device 2200 may be, for example, a memory stick, a solid state disk (SSD), a laptop computer, a desktop computer, a personal digital assistant (FDA), audio player, or the like where the advantages of embodiments of the present invention as described herein are especially beneficial.

Therefore the present invention provides an apparatus, method, and system for programming a multiple-bit per cell memory cell that reduces the number of highest programming states used to program a given field of data and hence provides a non-volatile memory device having tighter distribution of programmed cell threshold voltage ($V_{th}$), reduced power consumption, reduced programming time, and enhanced device reliability compared to the state of the art heretofore.

The embodiments of the invention described above are intended to be exemplary only. The scope of the invention is therefore intended to be limited solely by the scope of the appended claims.

| Table of Elements | |
|---|---|
| Element Name | Reference Number |
| Non-Volatile Memory Apparatus | 100 |
| Memory Array | 102 |
| Block | 104 |
| Controller | 106 |
| Interconnection | 108 |
| Interface | 110 |
| Polarity Control | 112 |
| Page | 202 |
| Data Field | 302 |
| Spare Field | 304 |
| MBC Memory Cell | 306 |
| Polarity Flags | 308 |
| Error Correction Code (ECC) | 310 |
| Threshold Voltage | 402 |
| States/Threshold Voltages 1 to 4 | 404, 406, 408, 410 |
| Example Threshold Voltage Distribution | 500 |
| Vertical Axis, Number of Cells | 502 |
| Horizontal Axis, Voltage | 504 |
| Reference Voltages 1 to 3 | 506, 508, 510 |
| Program From State 1 to 2 | 512 |
| Program From State 2 to 3 | 514 |
| Program From State 1 to 4 | 516 |
| Lower Bit | 602 |
| Upper Bit | 604 |
| Lower Page | 702 |
| Lower Data Field | 704 |
| Lower Spare Field | 706 |
| Lower Polarity Flag | 708 |
| Lower ECC | 710 |
| Upper Page | 712 |
| Upper Data Field | 714 |
| Upper Spare Field | 716 |
| Upper Polarity Flag | 718 |
| Upper ECC | 720 |

-continued

Table of Elements

| Element Name | Reference Number |
|---|---|
| Threshold Voltage Distribution | 802, 804, 806 |
| Method of Programming Flowchart | 900 |
| Program Lower Page | 902 |
| Disconnect between 902 and 904 | 903 |
| Program Upper Page | 904 |
| Detailed Method of Programming Flowchart | 1000 |
| Steps for Programming Lower Page | 1002 to 1012 |
| Steps for Programming Upper Page | 1014 to 1024 |
| Steps for Programming Lower Data Word | 1102 to 1104 |
| Steps for Programming Upper Data Word | 1202 to 1214 |
| Reading Upper Data Word Flowchart | 1300 |
| Steps for Reading Upper Data Word | 1302 to 1310 |
| Reading Lower Data Word Flowchart | 1400 |
| Steps for Reading Lower Data Word | 1402 to 1410 |
| Memory System | 1500 |
| Memory Controller | 1502 |
| Host interface | 1504 |
| Parallel Bus | 1506 |
| iNon-Volatile Memory | 1600 |
| Memory System | 1700 |
| Memory Controller w/Polarity Control | 1702 |
| Non-Volatile Memory w/Serial Interface | 1800 |
| Serial Input Interface | 1802 |
| Serial Output interface | 1804 |
| Memory System w/Serial Interconnect | 1900 |
| Memory Controller w/Serial Interface | |
| Serial Output | 1904 |
| Serial Input | 1906 |
| Non-Volatile Memory w/Serial Interface | 2000 |
| Memory System | 2100 |
| Memory Controller w/Serial Interface and Polarity Control | 2102 |
| Electric Device | 2200 |

We claim:

1. A multiple-bit per cell (MBC) non-volatile memory apparatus comprising:
a memory array including an electrically erasable block;
the block including a reprogrammable page;
the reprogrammable page comprising an upper and a lower page sharing a common word-line;
the upper and lower pages including respective upper and lower data fields;
the upper and lower data fields including respective virtual upper and lower cells of MBC memory cells;
the MBC memory cells having respective threshold voltages programmable to a selected one of first level, second level, third level, or fourth level in order from the lowest voltage level,
wherein programming the lower cells comprises programming the respective threshold voltages from the first threshold voltage level to the second threshold voltage level, and
programming the upper cells comprises programming the respective threshold voltages from the first threshold voltage level to the fourth threshold voltage level or from the second threshold voltage level to the third threshold voltage level; and
a controller for writing data to the memory array, wherein the controller controls polarity by selectively inverting a data word to maximize a number of bits within a lower page to be programmed and selectively inverting a data to minimize a number of bits to be programmed in the respective upper page,
wherein the upper and lower pages further includes respective upper and lower spare fields and the upper and lower spare fields including respective upper and lower error correction codes (ECC).

2. The apparatus as claimed in claim 1 wherein the upper and lower pages comprise respective upper and lower spare fields.

3. The apparatus as claimed in claim 2 wherein the upper and lower spare fields comprise respective upper and lower page polarity flags.

4. The apparatus as claimed in claim 1 wherein the first level, the second level, the third level, and the fourth level of threshold voltages are defined as '11', '10', '00', and '01' combinations of the upper and lower cells each respectively.

5. The apparatus as claimed in claim 4 wherein the first level threshold voltage represents an erased state.

6. The apparatus as claimed in claim 4 wherein the first level threshold voltage represents an unprogrammed upper cell and an unprogrammed lower cell.

7. The apparatus as claimed in claim 1 wherein the second level threshold voltage represents an unprogrammed upper cell and a programmed lower cell.

8. The apparatus as claimed in claim 1 wherein the third level threshold voltage represents a programmed upper cell and a programmed lower cell.

9. The apparatus as claimed in claim 1 wherein the second level threshold voltage represents a programmed upper cell and a unprogrammed lower cell.

10. The apparatus as claimed in claim 1 wherein the upper and lower spare fields include respective upper and lower polarity flags.

11. A multiple-bit per cell (MBC) non-volatile memory apparatus comprising:
a memory array including an electrically erasable block;
the block including a reprogrammable page;
the reprogrammable page comprising an upper and a lower page sharing a common word-line;
the upper and lower pages including respective upper and lower data fields;
the upper and lower data fields including respective virtual upper and lower cells of MBC memory cells;
the MBC memory cells having respective threshold voltages programmable to a selected one of first level, second level, third level, or fourth level in order from the lowest voltage level,
wherein programming the lower cells comprises programming the respective threshold voltages from the first threshold voltage level to the second threshold voltage level, and
programming upper cells comprises programming the respective threshold voltages from the first threshold voltage level to the fourth threshold voltage level or from the second threshold voltage level to the third threshold voltage level; and
a controller for writing data to the memory array, wherein the controller controls polarity by selectively inverting a data word to maximize a number of bits within a lower page to be programmed and selectively inverting a data to minimize a number of bits to be programmed in the respective upper page,
wherein the controller comprises means for erasing the blocks.

12. The apparatus as claimed in claim 1 wherein the controller comprises means for reading a data from the memory array wherein the controller includes means for reading a data word from a page, means for decoding the data word into lower and upper data words, means for inverting the lower data word if a lower page polarity flag is set, and means for inverting the upper data word if an upper page polarity flag is set.

13. A solid-state disk (SSD) comprising a multiple-bit per cell (MBC) non-volatile memory apparatus comprising: a memory array having a block; and a controller configured to write data to the memory array,
the block of the memory array including a page having upper and lower pages sharing common word-lines, the upper and lower pages including upper and lower data fields, respectively, the upper and lower data fields including virtual upper and lower cells of MBC memory cells, respectively,
the MBC memory cells having respective threshold voltages programmable to selected one of first level, second level, third level, or fourth level in order from the lowest voltage level, wherein programming the lower cells comprises programming the respective threshold voltages from the first threshold voltage level to the second threshold voltage level, and programming upper cells comprises programming the respective threshold voltages from the first threshold voltage level to the fourth threshold voltage level or from the second threshold voltage level to the third threshold voltage level; and
the controller being configured to control polarity by selectively inverting data to maximize a number of the bits within a lower page to be programmed and selectively inverting data to minimize a number of bits to be programmed in the respective upper page.

14. The SSD as claimed in claim 13 wherein the upper and lower pages of the page comprise upper and lower spare fields, respectively.

15. The SSD as claimed in claim 14 wherein the upper and lower spare fields of the upper and lower pages comprise upper and lower page polarity flags, respectively.

16. The SSD as claimed in claim 13 wherein the first, second, third and fourth levels of the threshold voltages are defined as '11', '10', '00', and '01' combinations of the upper and lower cells each respectively.

17. The SSD as claimed in claim 16 wherein the first level threshold voltage represents an erased state.

18. The SSD as claimed in claim 16 wherein the first level threshold voltage represents an unprogrammed upper cell and an unprogrammed lower cell.

19. The SSD as claimed in claim 13 wherein the second level threshold voltage represents an unprogrammed upper cell and a programmed lower cell.

20. The SSD as claimed in claim 13 wherein the third level threshold voltage represents a programmed upper cell and a programmed lower cell.

21. The SSD as claimed in claim 13 wherein the second level threshold voltage represents a programmed upper cell and an unprogrammed lower cell.

22. The SSD as claimed in claim 13 wherein the upper and lower pages further comprise upper and lower spare fields, respectively.

23. The SSD as claimed in claim 22 wherein the upper and lower spare fields include upper and lower polarity flags, respectively.

24. The SSD as claimed in claim 13 wherein the controller comprises a data reader configured to read data from the memory array, the controller including
a sensor configured to sense threshold voltages of MBC cells within a page,
a data provider configured to provide an upper data word by comparing the threshold voltages to a predetermined voltage reference, and
a data inverter configured to invert the upper data word if a upper page polarity flag is set.

25. The SSD as claimed in claim 13 wherein the controller comprises a data reader configured to read data from the memory array, the controller including
a sensor configured to sense threshold voltages of MBC cells within a page,
a data provider configured to provide a lower data word by comparing the threshold voltages to two predetermined voltage references, and
a data inverter configured to invert the lower data word if a lower page polarity flag is set.

26. A solid-state disk (SSD) comprising a multi-bit per cell (MBC) non-volatile memory including a data reader configured to read data, the SSD comprising:
a sensor configured to sense threshold voltages of MBC cells within a page;
a data provide configured to provide an upper data word by comparing the threshold voltages to a predetermined voltage reference; and
a data inverter configured to invert the upper data word if an upper page polarity flag is set.

27. The SSD as claimed in claim 26 wherein the data inverter comprises a reader configured to read the upper page polarity flag from a spare field.

* * * * *